(12) United States Patent
Furusawa et al.

(10) Patent No.: US 6,358,838 B2
(45) Date of Patent: Mar. 19, 2002

(54) SEMICONDUCTOR DEVICE AND PROCESS FOR PRODUCING THE SAME

(75) Inventors: Takeshi Furusawa, Hino; Daisuke Ryuzaki, Kokubunji; Noriyuki Sakuma, Hachioji; Shuntaro Machida, Kokubunji; Kenji Hinode, Hachioji; Ryou Yoneyama, Kodaira, all of (JP)

(73) Assignees: Hitachi, Ltd.; Hitachi ULSI Systems Co., Ltd., both of Tokyo (JP)

( * ) Notice: Subject to any disclaimer, the term of this patent is extended or adjusted under 35 U.S.C. 154(b) by 0 days.

(21) Appl. No.: 09/760,777

(22) Filed: Jan. 17, 2001

(30) Foreign Application Priority Data

Jan. 18, 2000 (JP) .......................................... 12-013895

(51) Int. Cl.[7] .......................................... H01L 21/311
(52) U.S. Cl. ........................ 438/622; 438/623; 438/637; 438/703
(58) Field of Search .................. 156/643; 438/671, 438/637, 641, 703, 782, 787, 622, 623

(56) References Cited

U.S. PATENT DOCUMENTS 5,407,529 A * 4/1995 Homma ...................... 156/643

FOREIGN PATENT DOCUMENTS

JP 11-288931 10/1999

OTHER PUBLICATIONS

Y. Shimooka et al, "Fully Planarized High Density Plasma CVD Fluorine–Doped ILD", VMIC Conference, Jun. 1997, pp. 119–124.

H.W. Thompson et al, "Etch Process Development for FLARE for Dual Damascene Architecture Using a N2/O2 Plasma", IITC, 1999, pp. 59–61.

L. Peters, "Solving the Integration Challenges of Low–k Dielectrics", Semiconductors International, Nov. 1999, pp. 56–64.

F. Moghadam, "Integration Challenges at 0.15um Technology Node", Proceedings of International Society for Optical Engineering (SPIE), vol. 3881, 1999, pp. 8–14.

M.J. Loboda et al, "Deposition of Low–K Dielectric Films Using Trimethylsilane", Electrochemical Society Proceedings, vol. 98–6, 1998.

60th Japan Society of Applied Physics Scientific Lectures, Preprint 1p–ZN–9, Sep., 1999.

* cited by examiner

*Primary Examiner*—Roy Potter
(74) *Attorney, Agent, or Firm*—Mattingly, Stanger & Malur, P.C.

(57) ABSTRACT

An intermetal insulating film containing at least silicon atoms, oxygen atoms and carbon atoms with the number ratio of oxygen atom to silicon atom being 1.5 or more and the number ratio of carbon atom to silicon atom being 1 to 2, and having a film thickness shrinkage at a time of oxidation of 14% or less is very low in dielectric constant, high in selectivity against resist etching and can be used without using a silicon oxide protective film in a semiconductor device.

23 Claims, 22 Drawing Sheets

SEMICONDUCTOR DEVICE AND PROCESS FOR PRODUCING THE SAME

BACKGROUND OF THE INVENTION

This invention relates to a semiconductor device and a process for producing the same. More particularly, the present invention relates to a semiconductor device suitable for high speed operation with low consuming electric power and a process for producing the same.

With miniaturization of semiconductor devices, parasitic capacitance of multilevel wiring becomes the same level as parasitic capacitance of transistor per se, and operational speed of LSI devices strongly depends on the wiring capacitance. Thus, introduction of insulating films having a relative dielectric constant (k) lower than that of a conventional silicon oxide film (k~4) (hereinafter referred to as "a low dielectric constant film") has been studied extensively.

FIGS. 1 to 4 are cross-sectional views explaining how to use a conventional low dielectric constant film. These drawings show a step of forming inlaid wires by a damascene process as an example. First, a silicon oxide film 9 as a protective film is formed on a low dielectric constant film 8 in about 100 nm thick or more to form a layered film, on which a trench pattern 16 is formed (FIG. 1). After removing the resist 6 (FIG. 2), a thin film of titanium nitride, tantalum nitride, or the like is formed as a barrier metal, followed by formation of copper 18 (FIG. 3). Then, the copper and the barrier metal are removed by chemical-mechanical polishing (CMP) method, while retaining the copper and the barrier metal only in the trench pattern to form electroconductive portions such as wires and vias (FIG. 4).

As the material for the low dielectric constant film 8, the following three materials, that is, fluorinated siloxane type insulating films (k~3.5), organic polymer type insulating films (k~3), and organic siloxane type insulating films (k~3) have been mainly studied.

Among them, the fluorinated siloxane type insulating films are a film having Si—O—Si networks terminated by Si—F bonds (see Proceedings of VLSI Multilevel Interconnection Conference 1997, p. 119–124). The fluorine in the film reacts with a barrier metal 17 such as titanium nitride, tantalum nitride, etc. In order to prevent delamination, silicon oxide protective film 9 is used.

The organic polymer type insulating films include a film having networks made of carbon. As the polymer, benzocyclobutene type, aromatic resins, and the like are mainly studied. Since both the organic polymer film and the resist 6 are organic films, etching selecvtivity of the polymer to the resist is low. Thus, in order to obtain practical pattern processing conditions good in shape controlling properties, a silicon oxide protective film 9 is used as a hard mask (see Proceedings of International Interconnect Technology Conference 1999, p. 59–61).

The organic siloxane type insulating films are a film having Si—O—Si networks terminated by Si—R bonds (R is an organic group). As the R, it is general to use a methyl group excellent in heat resistance. As another component, it is possible to include Si—H bonds. The organic siloxane type insulating films have weak adhesiveness to a metal such as titanium nitride, tantalum nitride, etc. Thus, in order to prevent delamination of the metal during CMP, it is desirable to use as an adhesion layer a silicon oxide protective film 9 (see Semiconductor International November 1999, p. 56–64).

As a process for forming the organic siloxane type insulating film, there have been studied a process of spin coating an alcohol solution of methylalkoxysilane oligomer (an organic spin-on glass liquid), followed by baking, and other various chemical vapor deposition (CVD) processes.

A typical example of forming an organic siloxane insulating film by CVD process is conducted by using an organic silane and an oxidizing gas. For example, there are disclosed a plasma CVD process using $R_nSiH_{4-n}$ and an oxidizing gas (Proceedings of International Society for Optical Engineering (SPIE), vol. 3881, p. 8–14, 1999), and a plasma CVD process using $(CH_3)_3SiH$, $N_2O$ and He (Electrochemical Society Proceedings vol. 98–6, p. 145–152, 1998).

Another plasma CVD process using $(CH_3)_2Si(OCH_3)_2$ and an inert gas is disclosed in the 60th Japan Society of Applied Physics Scientific Lectures, Preprint 1p-ZN-9, 1999.9 held at Konan University. According to this report, the gas flow rate is reduced to about 1/10 of usual flow rate in order to prolong the residence time of the gases in a reactor. The results of this report are reflected in JP-A 11-288931.

The above-mentioned low dielectric constant intermetal insulating films require a silicon oxide film as a protective film on an upper surface. Considering a practical process margin, the film thickness is required to be about 100 nm at the minimum. This thickness is about 1/3 of the wire thickness of fine wiring (e.g. about 300 nm in 0.18 μm-node CMOS devices). Thus, an effective dielectric constant between adjacent wires is greatly influenced by the dielectric constant of silicon oxide protective film (k~4) to make the dielectric constant higher than that of the low dielectric constant film per se.

Among the low dielectric constant films mentioned above, the use of a protective film is inevitable in the case of the fluorinated siloxane type insulating films and the organic polymer type insulating films. When the amount of fluorine in the fluorinated siloxane type insulating films is reduced, the low dielectric constant properties of the film are lost. In the case of the organic polymer type insulating films, the etching selectivity against resist etching cannot be enhanced essentially.

In contrast, in the case of the organic siloxane type insulating films, a component such as fluorine which reacts with the metal is not included. Furthermore, the selectivity against resist etching can be enhanced. Therefore, if the problem of delamination is solved, it is possible to use the organic siloxane type insulating films without using a silicon oxide protective film.

But, when the carbon in the film is remarkably large as in the case of the film formed by plasma CVD process using $(CH_3)_3SiH$, $N_2O$, and He mentioned above, it is impossible to enhance the selective ratio against resist etching. When the carbon content is reduced, adhesiveness is clearly improved, but the dielectric constant is also increased.

SUMMARY OF THE INVENTION

It is an object of the present invention to provide a semiconductor device using as an intermetal insulating film an organic siloxane type insulating film having a low dielectric constant, and a high selectivity against resist etching and causing no problem of delamination without using a silicon oxide protective film, and a process for producing the same.

The present invention provides a semiconductor device including one or more intermetal insulating films, each intermetal insulating film containing at least silicon atoms, oxygen atoms, and carbon atoms with the number ratio of oxygen atom to silicon atom being 1.5 or more and the number ratio of carbon atom to silicon atom being 1 to 2, and having a shrinkage in the film thickness direction at a time of oxidation of 14% or less.

The present invention also provides a process for producing a semiconductor device comprising a step of forming an intermetal insulating film using a mixed gas comprising
(i) a vapor of monomethyltriethoxysilane represented by the formula: RSi(OR')$_3$, wherein R is a methyl group and R' is an ethyl group, and a non-oxidizing gas
(ii) a vapor of methylethoxysilane represented by the formula: R$_n$Si(OR')$_{4-n}$, wherein R is a methyl group, R' is an ethyl group, and n is 0 to 2, said vapor being mixed so as to make R 0.75 to 1.5 per silicon, and a non-oxidizing gas, or
(iii) (a) a vapor of monomethyltriethoxysilane represented by the formula: RSi(OR')$_3$, wherein R and R' are each methyl group, or (b) a vapor of methylmethoxysilane represented by the formula: R$_n$Si(OR')$_{4-n}$, wherein R and R' are each methyl group, and n is 0 to 2, said vapor being mixed so as to make R 0.75 to 1.5 per silicon, and a non-oxidizing gas, by means of a plasma chemical vapor deposition method, and a step of forming wires.

DETAILED DESCRIPTION OF THE INVENTION

The present inventors have found that disadvantages produced by using the prior art organic siloxane insulating films can be solved by using an organic siloxane insulating film having a small volume change (shrinkage particularly in the film thickness direction) at the time of oxidation, and accomplished the present invention.

For example, according to JP-A 11-288931, since a silicon hydrocarbon compound, e.g. a compound having at least one Si—O bond, two or less O—C$_n$H$_{2n+1}$ bonds, and at least two hydrocarbon groups such as methyl groups being bound to Si, is used as a reaction gas, the resulting insulating film is poor in adhesiveness to a metal such as titanium nitride, tantalum nitride, etc. Further, since no Si—C—Si bond is formed, it is impossible to expect prevention of shrinkage caused by oxidation.

When a metal layer is formed on the conventional organic siloxane insulating film without a protective layer, only the metal layer is delaminated from the surface of the insulating film. This is because the organic component (methyl group) in the insulating film inhibit the adhesiveness.

Figure 1:
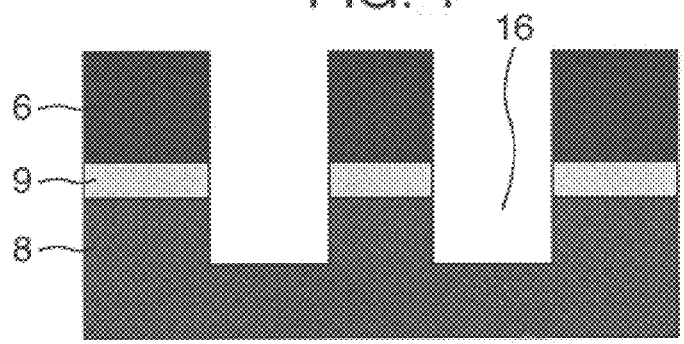
FIGS. 1 to 4 are cross-sectional views explaining a prior art process for producing a semiconductor device using a low dielectric constant intermetal insulating film.
Figure 2:
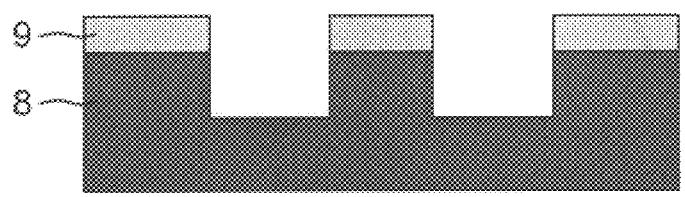
Figure 3:
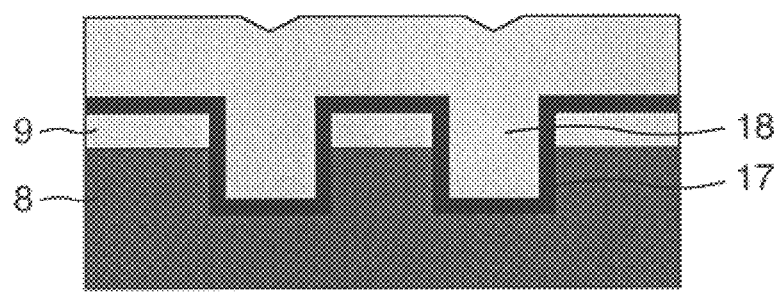
Figure 4:
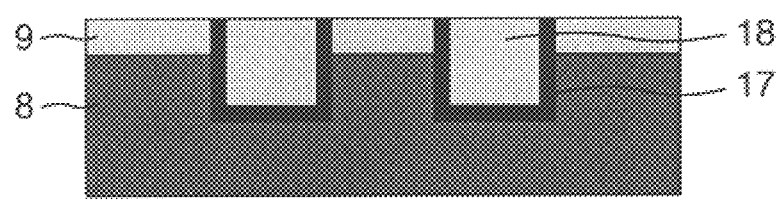
Figure 5:
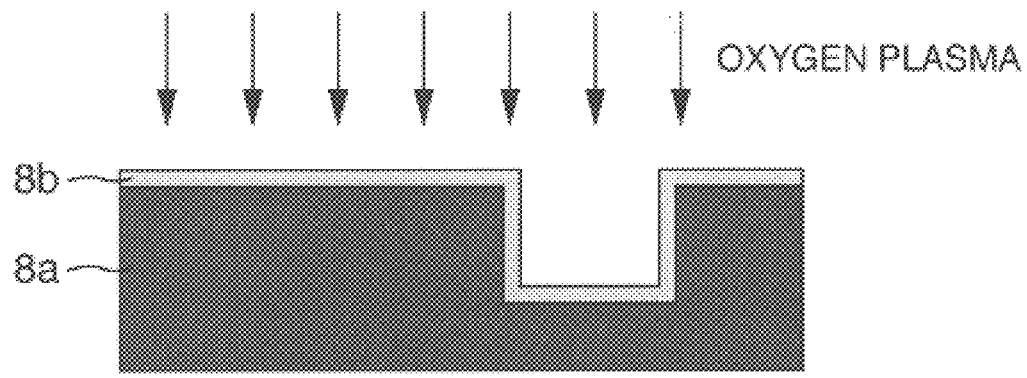
FIGS. 5 and 6 are cross-sectional views explaining problems in prior art organic siloxane intermetal insulating films.
Figure 6:
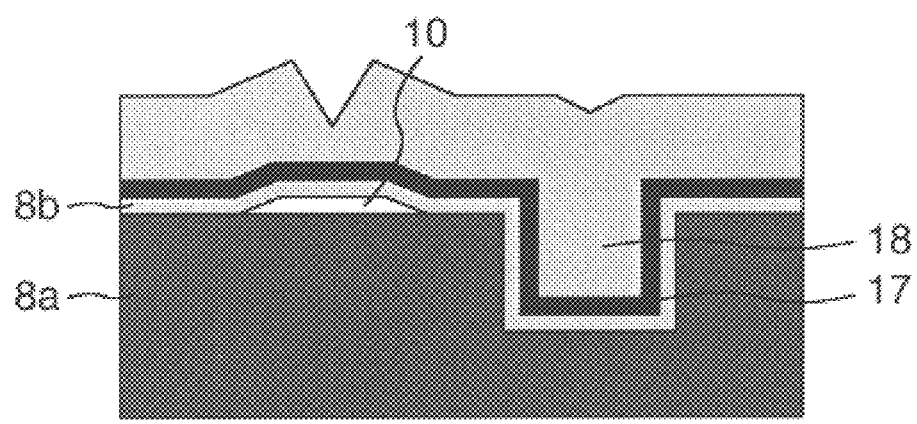

But in a practical process, the mechanism of delamination is different to some extent. On the surface of the organic siloxane insulating film 8a forming the trench pattern, a thin oxide layer 8b is produced (FIG. 5). This is because the surface is oxidized by an oxygen plasma treatment for removing a resist. The film thickness of the oxide layer depends mainly on the pressure of oxygen plasma treatment. When the pressure is 50 mTorr or less, the film thickness can be made about 10 nm or less. The adhesiveness between the oxide layer and a metal such as titanium nitride, tantalum nitride, etc. is sufficiently strong. But, when there is mechanical strain between the oxide layer 8b and the non-oxidized organic siloxane insulating film Ba under the oxide layer, a portion of the interface is delaminated during the chemical-mechanical polishing (FIG. 6). The larger the shrinkage at the time of oxidation, the greater the mechanical strain.

In a practical process, only the surface is oxidized so as not to oxidize the inside of film. In such a case, it is difficult to measure the shrinkage precisely. Therefore, in the present invention, the shrinkage is measured by intentionally oxidizing the inside of the film using a high-pressure plasma treatment, which is not used in the practical process. The resulting shrinkage is used for the definition in the present invention for convenience. Film materials having a smaller shrinkage according to the above definition, show smaller shrinkage and smaller mechanical strain when only the surface is oxidized, resulting in giving almost no delamination fundamentally. In order to sufficiently oxidize the inside of the film, the oxygen plasma treatment can be conducted under a high pressure of 1 Torr or more. A suitable film thickness for the measurement is preferably about 100 to 300 nm. When the thickness is too small, the measurement becomes inaccurate, while when the thickness is too large, oxidation into the inside of the film becomes difficult.

Figure 7:
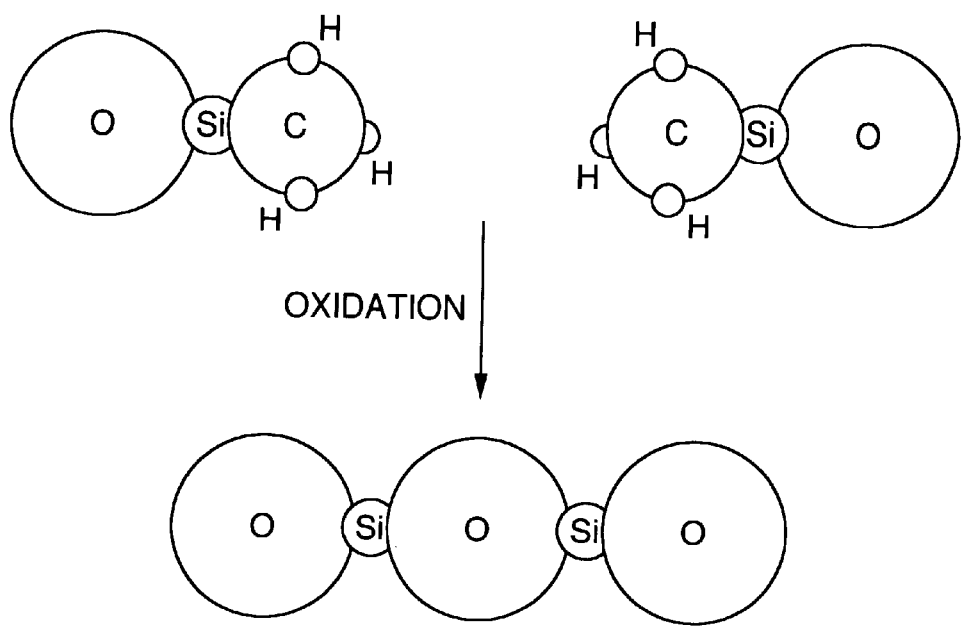
FIG. 7 is a rough sketch explaining a volume change of Si—CH$_3$ by oxidation.
Figure 12:
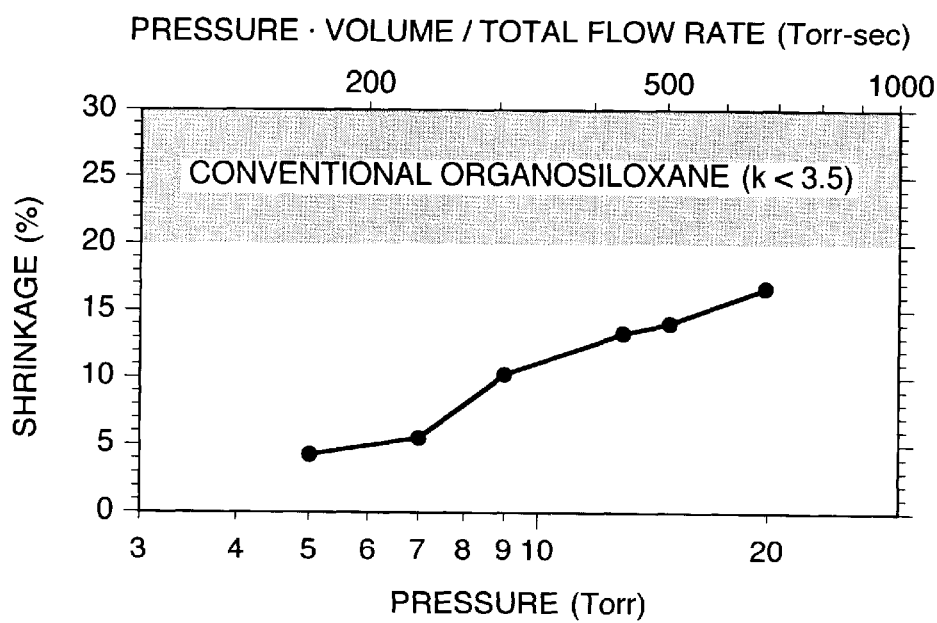
FIG. 12 is a graph showing pressure dependency of the film thickness shrinkage obtained in Example 2 of the present invention.

When the conventional organic siloxane insulating film (k~3) is oxidized by this way, the shrinkage becomes 20% or more as shown in FIG. 12. This is because separated Si atoms by Si—CH$_3$ bond are combined to form a siloxane bond (Si—O—Si) (FIG. 7). When Si—H bond is contained in the film, this bond also contributes to the shrinkage of the film.

Figure 8:
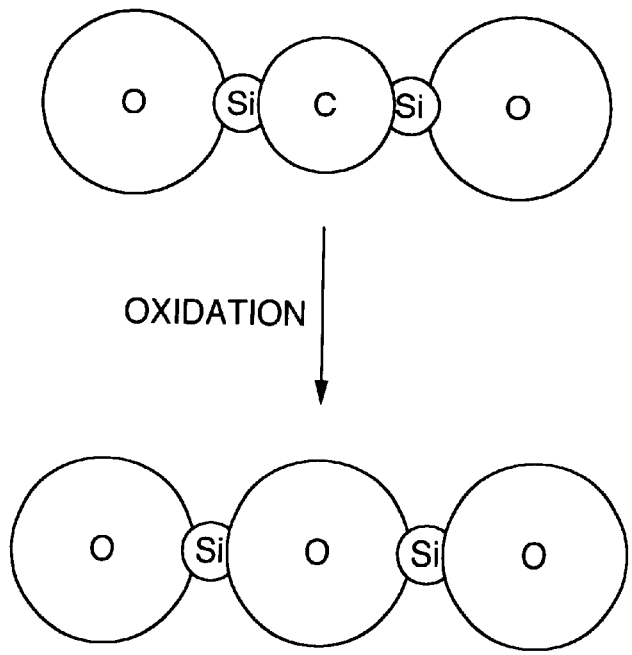
FIG. 8 is a rough sketch explaining a volume change of Si—C—Si by oxidation.

As the organic component which does not bring about shrinkage due to oxidation, there is a Si—C—Si bond. When this bond is replaced by the siloxane bond by oxidation, the volume is not changed largely (FIG. 8), rather, slightly increases. Thus, by replacing a part of the Si—CH$_3$ bond by the Si—C—Si bond, the shrinkage of the insulating film at the time of oxidation can be controlled 14% or less, preferably 10% or less without causing the problem of delamination of the organic siloxane insulating film.

This is a novel inventive idea not taught by JP-A 11-288931 wherein a large amount of Si—$CH_3$ bonds are used and there is no inventive idea of replacing a part of the Si—$CH_3$ bond by the Si—C—Si bond.

According to the present invention, there is provided a semiconductor device including one or more intermetal insulating films, each intermetal insulating film containing at least silicon atoms, oxygen atoms, and carbon atoms with the number ratio of oxygen atom to silicon atom being 1.5 or more and the number ratio of carbon atom to silicon atom being 1 to 2, and having a shrinkage in the film thickness direction at a time of oxidation of 14% or less.

It is preferable to make the shrinkage in the film thickness direction at a time of oxidation 10% or less.

The number ratio of oxygen atom to silicon atom is preferably 1.5 or more and the number ratio of carbon atom to silicon atom is preferably 1 to 2. When the number of carbon atoms is small, it is impossible to make the intermetal insulating film have low dielectric constant (k<3.5). when the number of oxygen atoms is too small or the number of carbon atoms is too large, it is impossible to enhance the selective ratio against resist etching.

The intermetal insulating film preferably has all of Si—$CH_3$ bond, Si—O—Si bond and Si—C—Si bond.

The semiconductor device of the present invention can be produced by a process comprising:

a step of forming an intermetal insulating film using a mixed gas comprising
  (i) a vapor of monomethyltriethoxysilane represented by the formula: RSi(OR')$_3$, wherein R is a methyl group and R' is an ethyl group, and a non-oxidizing gas
  (ii) a vapor of methylethoxysilane represented by the formula: $R_n$Si(OR')$_{4-n}$, wherein R is a methyl group, R' is an ethyl group, and n is 0 to 2, said vapor being mixed so as to make R 0.75 to 1.5 per silicon, and a non-oxidizing gas, or
  (iii) (a) a vapor of monomethyltriethoxysilane represented by the formula: RSi(OR')$_3$, wherein R and R' are each methyl group, or (b) a vapor of methylmethoxysilane represented by the formula: $R_n$Si(OR')$_{4-n}$, wherein R and R' are each methyl group, and n is 0 to 2, said vapor being mixed so as to make R 0.75 to 1.5 per silicon, and a non-oxidizing gas, by means of a plasma chemical vapor deposition method, and
a step of forming wires.

These steps can be repeated a plurality of times to obtain the predetermined numbers of the intermetal insulating films and the wiring layers.

In the above-mentioned process, individual Si—OR'bonds combine to form Si—O—Si bonds, while partly decomposed Si—$CH_3$ bonds combine to form Si—C—Si bonds.

In the above process, the non-oxidizing gas should be used. When an oxidizing gas is used, the Si—$CH_3$ bonds and Si—C—Si bonds necessary for the intermetal insulating film are decomposed. It is preferable to remove unnecessary organic component (R') not contributing to the binding of the film from the resulting film as large as possible.

As the non-oxidizing gas, it is preferable to use a gas containing a reducing component such as nitrogen, hydrogen, ammonia or a mixture thereof, and to remove the organic components in the form of HCN, comparing with a simple use of an inert gas such as He, Ar, etc. When hydrogen or ammonia is used, it is necessary to use an apparatus for removing such a gas from the viewpoint of safety, resulting in making the apparatus complicated. Considering this, the use of a mixture of a nitrogen gas and an inert gas such as He, Ar, etc. is more preferable.

Further, in order to reduce the unnecessary organic components from the resulting film, it is preferable to heat a substrate such as a semiconductor substrate at 350 to 400° C. during the film formation.

In order to form the Si—C—Si bonds by the above-mentioned CVD process, it is preferable to make the residence time of the reaction gas in the reactor (or reaction chamber) shorter. When the residence time is long, carbon components in the reaction products in the atmosphere of the reactor become larger. As a result, the decomposition reaction of Si—$CH_3$ is suppressed, and production of Si—C—Si is reduced. In addition, the amount of unnecessary organic components (R') not contributing to the binding of the film increases.

Figure 11:
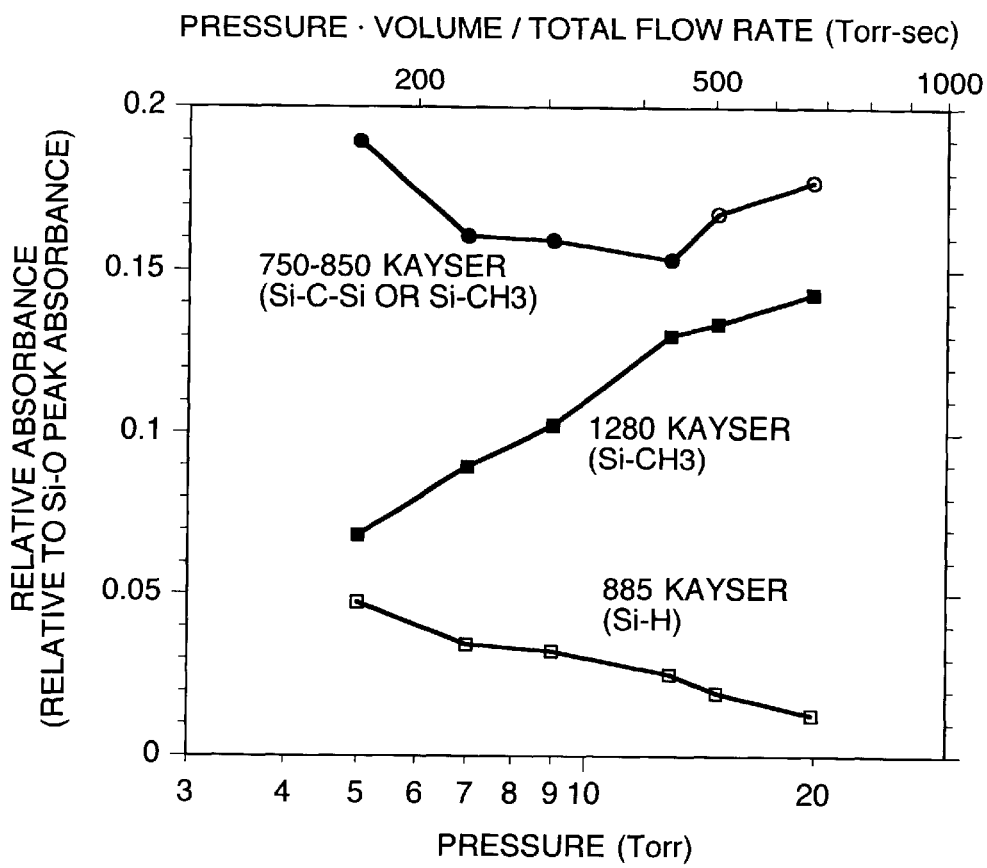
FIG. 11 is a graph showing pressure dependency of FTIR spectra obtained in Example 2 of the present invention.

As an amount proportional to the residence time, there is a factor of (pressure in the reactor)·(volume of the reactor)/(total gas flow rate) [in FIG. 11, this factor is simply expressed by "PRESSURE·VOLUME/TOTAL FLOW RATE"]. In order to form the Si—C—Si bond and to suppress the shrinkage of the resulting film, it is preferable to make this factor 500 Torr.sec or less, more preferably 280 Torr.sec or less.

In order to make the amount of carbon and oxygen in the resulting insulating film suitable, it is preferable to make R in the methylalkoxysilane 0.75 to 1.5 per silicon when R' is a methyl group, and 0.75 to 1.5 per silicon when R' is an ethyl group, while n is 0 to 2 in the formula: $R_n$Si(OR')$_{4-n}$. So long as satisfying the above conditions, it is possible to use a single vapor (e.g. n=1) or a mixed vapor of alkoxysilanes (n=0–2). From the viewpoint of simplicity of the apparatus, it is preferable to use a single vapor. In addition, there is no difference whether R' is a methyl group or an ethyl group, but considering the vapor pressure and easiness for handling, the case wherein R' is an ethyl group is more preferable.

The semiconductor device of the present invention includes further the following embodiments.

(1) A semiconductor device including one or more wiring layers, each layer having a plurality of inlaid wires and intermetal insulating films between individual trench wires, said intermetal insulating film being a single layer film of a low dielectric constant film having a dielectric constant lower than that of a silicon oxide film.

(2) A semiconductor device mentioned in above (1), wherein the low dielectric constant film contains at least silicon atoms, oxygen atoms and carbon atoms with the number ratio of oxygen atom to silicon atom being 1.5 or more and the number ratio of carbon atom to silicon atom being 1 to 2, and has a shrinkage in the film thickness direction at a time of oxidation of 14% or less.

(3) A semiconductor device mentioned in above (1), wherein the low dielectric constant film contains at least silicon atoms, oxygen atoms and carbon atoms with the number ratio of oxygen atom to silicon atom being 1.5 or more and the number ratio of carbon atom to silicon atom being 1 to 2, and has a shrinkage in the film thickness direction at a time of oxidation of 10% or less.

(4) A semiconductor device including one or more wiring layers, each layer having a plurality of inlaid wires and intermetal insulating films between individual trench wires, said intermetal insulating film being a stack of a plurality of insulating films, the uppermost insulating film being a low dielectric constant film having a dielectric constant lower than that of a silicon oxide film.

(5) A semiconductor device mentioned in above (4), wherein the low dielectric constant film contains at least silicon atoms, oxygen atoms and carbon atoms with the number ratio of oxygen atom to silicon atom being 1.5 or more and the number ratio of carbon atom to silicon atom being 1 to 2, and has a shrinkage in the film thickness direction at a time of oxidation of 14% or less.

(6) A semiconductor device mentioned in above (4), wherein the low dielectric constant film contains at least silicon atoms, oxygen atoms and carbon atoms with the number ratio of oxygen atom to silicon atom being 1.5 or more and the number ratio of carbon atom to silicon atom being 1 to 2, and has a shrinkage in the film thickness direction at a time of oxidation of 10% or less.

Further, the process for producing a semiconductor device of the present invention includes the following embodiments.

(7) A process for producing a semiconductor device which comprises
- a step forming an intermetal insulating film containing at least silicon atoms, oxygen atoms, and carbon atoms with the number ratio of oxygen atom to silicon atom being 1.5 or more and the number ratio of carbon atom to silicon atom being 1 to 2, and having a shrinkage in the film thickness direction at a time of oxidation of 14% or less,
- a step of forming one or more trenches or holes in the intermetal insulating film,
- a step of depositing a metal film so as to fill the trenches or holes, and
- a step of removing the metal film from portions other than insides of the trenches or holes by chemical-mechanical polishing process.

(8) A process mentioned in above (7), which further comprises a step of exposing the intermetal insulting film to plasma containing oxygen under a pressure of 50 mTorr or less.

(9) A process for producing a semiconductor device which comprises
- a step forming an intermetal insulating film containing at least silicon atoms, oxygen atoms, and carbon atoms with the number ratio of oxygen atom to silicon atom being 1.5 or more and the number ratio of carbon atom to silicon atom being 1 to 2, and having a shrinkage in the film thickness direction at a time of oxidation of 10% or less,
- a step of forming one or more trenches or holes in the intermetal insulating film,
- a step of depositing a metal film so as to fill the trenches or holes, and
- a step of removing the metal film from portions other than insides of the trenches or holes by chemical-mechanical polishing process.

(10) A process mentioned in above (9), which further comprises a step of exposing the intermetal insulting film to plasma containing oxygen under a pressure of 50 mTorr or less

(11) A process for producing a semiconductor device which comprises
- a step of forming a first wire by dry etching of a metal film,
- a step of forming a first insulating film containing at least silicon atoms, oxygen atoms, and carbon atoms with the number ratio of oxygen atom to silicon atom being 1.5 or more and the number ratio of carbon atom to silicon atom being 1 to 2, and having a shrinkage in the film thickness direction at a time of oxidation of 14% or less,
- a step of forming a coated insulating film,
- a step of forming a second insulating film containing at least silicon atoms, oxygen atoms and carbon atoms with the number ratio of oxygen atom to silicon atom being 1.5 or more and the number ratio of carbon atom to silicon atom being 1 to 2, and having a shrinkage in the film thickness direction at a time of oxidation of 14% or less,
- a step of forming holes in a stack comprising the first insulating film, the coated insulating film and the second insulating film so as to expose a surface of the first wire,
- a step of filling a metal film in the holes, and
- a step of removing the metal film from outside of the holes.

(12) A process mentioned in above (11), which further comprises a step of removing a resist used for forming the holes by a plasma treatment containing at least oxygen under a pressure of 50 mTorr or less between the step of forming the holes and the step of filling the metal film in the holes.

(13) A process for producing a semiconductor device which comprises
- a step of forming a first wire by dry etching of a metal film,
- a step of forming a first insulating film containing at least silicon atoms, oxygen atoms, and carbon atoms with the number ratio of oxygen atom to silicon atom being 1.5 or more and the number ratio of carbon atom to silicon atom being 1 to 2, and having a shrinkage in the film thickness direction at a time of oxidation of 10% or less,
- a step of forming a coated insulating film,
- a step of forming a second insulating film containing at least silicon atoms, oxygen atoms and carbon atoms with the number ratio of oxygen atom to silicon atom being 1.5 or more and the number ratio of carbon atom to silicon atom being 1 to 2, and having a shrinkage in the film thickness direction at a time of oxidation of 10% or less,
- a step of forming holes in a stack comprising the first insulating film, the coated insulating film and the second insulating film so as to expose a surface of the first wire,
- a step of filling a metal film in the holes, and
- a step of removing the metal film from outside of the holes.

(14) A process mentioned in above (13), which further comprises a step of removing a resist used for forming the holes by a plasma treatment containing at least oxygen under a pressure of 50 mTorr or less between the step of forming the holes and the step of filling the metal film in the holes.

The present invention is illustrated by way of the following Examples, but needless to say, not limited thereto.

EXAMPLE 1

Figure 9:
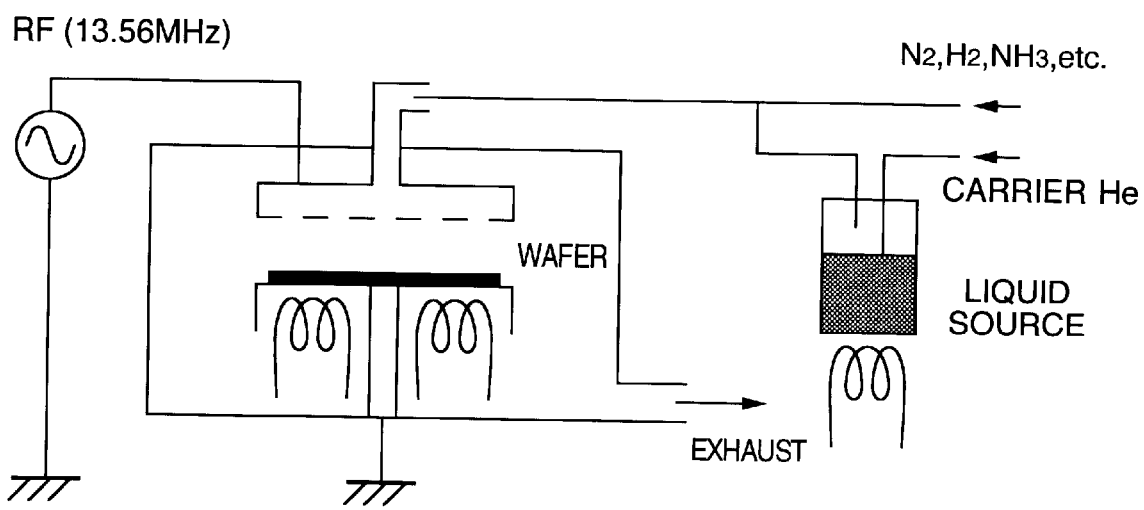
FIG. 9 is a diagrammatic view illustrating the plasma CVD apparatus used in Example 1 of the present invention.

Using a plasma CVD apparatus having a parallel plate type chamber as shown in FIG. 9, an organic siloxane film with 200 nm thick was formed on a Si substrate. Conditions for film formation were as follows:

Liquid source: monomethylethoxysilane
  $[CH_3Si(OC_2H_5)_3]$

Figure 10:
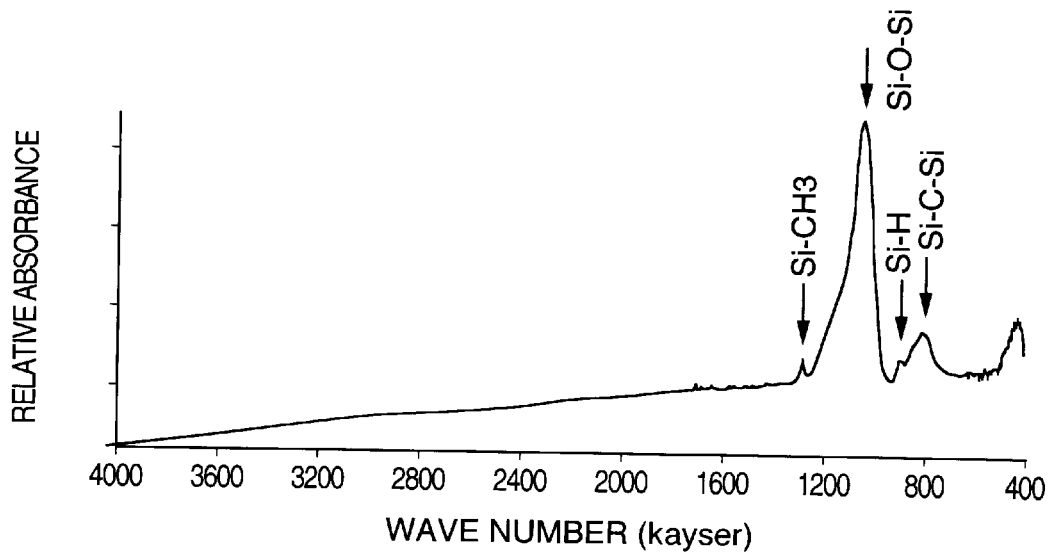
FIG. 10 shows FTIR spectrum obtained in Example 1 of the present invention.

Bubbler temperature: 37° C.
Carrier He flow rate: 200 sccm
$N_2$ flow rate: 200 sccm
Pressure: 5 Torr
Substrate temperature: 375° C.
RF power: 500 W
Electrode distance: 180 mils The formed film had a dielectric constant of 3.2, a dielectric breakdown voltage of 5 MV/cm. Measurement by a Fourier-transform infrared absorption spectrophotometry (FTIR) of the film revealed bonds of Si—O—Si, Si—$CH_3$, as well as Si—C—Si and Si—H obtained by decomposition of Si—$CH_3$ (FIG. 10). Number ratios of atoms in the film by an Auger analysis revealed C/Si being 1.6/1 and O/Si being 1.8/1. The nitrogen used as a reaction gas was also included in the film in the ratio of N/Si of about 0.1.

The resulting film was subjected to a high-pressure oxygen-plasma treatment using a barrel type ashing equipment. The treating conditions were an oxygen flow rate of 200 sccm, a pressure of 1 Torr, a RF power of 300 W, a time of 15 minutes.

The organic components in the film were decomposed to give an oxidized film. A change in film thickness measured by ellipsometry was less than 5%.

Separately, the same film as mentioned above was formed and subjected to an oxygen plasma treatment using a reactive ion etching apparatus employing low pressure conditions used for removing a resist from an organic siloxane film. The treating conditions were an oxygen flow rate of 50 sccm, a pressure of 10 mTorr, a RF power of 700 W and a time of 1 minute.

The organic components in the film were hardly decomposed and the surface of about 10 nm thick was oxidized. On this film, titanium nitride of 50 nm thick and copper of 500 nm thick were formed. Then, the surface was crosswisely scratched using a diamond needle and subjected to an adhesion test using an adhesive tape. No delamination of titanium nitride and copper was observed.

When He was used as an inert gas in place of the nitrogen, the results of adhesion test were not changed, but the carbon content in the film increased. This seems to be a large amount of unnecessary carbon components not contributing to bonding of the film.

When oxygen was used in place of the nitrogen, the bonds of Si—$CH_3$, Si—C—Si and Si—H were reduced. The film had a dielectric constant of 4 or more failing to obtain a low dielectric constant.

In order to reduce unnecessary carbon components and to obtain the above-mentioned properties, the use of a reducing gas such as nitrogen, hydrogen, ammonia, or a mixture thereof was most suitable.

Even if monomethyltrimethoxysilane [$CH_3Si(OCH_3)_3$] was used as a liquid source, the same results were obtained by lowering the bubbler temperature so as to obtain the same pressure as mentioned above.

EXAMPLE 2

Films were formed by changing the pressure to study film quality dependency. The film forming conditions were the same as those of Example 1 except for the pressure. Since the total gas flow rate was constant, the pressure was proportional to the residence time.

FIG. 11 shows the pressure dependency of FTIR spectra. The ordinate axis is normalized by the peak value of the Si—O—Si bond at the wavenumber of 1030 kayser. In the graph, the Si—$CH_3$ bond at 1280 kayser and the Si—H bond at 885 kayser are shown. At near 790 kayser, a plurality of Si—C—Si bonds with the same size are present and overlapped, resulting in failing to separate individually. Thus, the wavenumber showing the maximum peak and the maximum peak value between 750 to 850 kaysers are shown for convenience. Black circles show a case where the 790 kayser having the Si—C—Si bond is the maximum and white circles show a case wherein the 770 kaysers having the Si—$CH_3$ bond is the maximum.

When the pressure is high, the Si—$CH_3$ bond is large and the Si—H bond is small. Between 750–850 kaysers, the wavenumber showing the maximum peak is 770 kayser. This means that a reaction for producing Si—C—Si and Si—H by decomposition of Si—$CH_3$ does not take lace so much, resulting in retaining Si—$CH_3$ in a large amount. When the pressure becomes lower and lower, the Si—$CH_3$ bond decreases and the Si—H bond increases. The wavenumber showing the maximum peak between 750 to 850 kaysers is 790 kayser, which corresponds to the Si—C—Si bond. When the pressure becomes lower, the peak of the Si—C—Si bond increases. From the above results, it becomes clear that in order to produce Si—C—Si by decomposition of Si—$CH_3$, the residence time should be shortened.

FIG. 12 shows the shrinkage of film thickness during high-pressure oxygen plasma treatment using a barrel type asher (ashing equipment). The conditions for the oxygen plasma treatment are the same as those in Example 1. FIG. 12 shows that the shrinkage of film thickness is smaller, when the pressure is lower and the residence time is longer.

Further, in order to conduct the adhesion test, an insulating film of 200 nm thick was formed on a Si substrate, followed by low pressure oxygen plasma treatment to form titanium nitride and copper. The conditions for these treatment were the same as those of Example 1. Then, CMP was conducted to observe the presence of delamination.

No delamination was observed at all under the pressure of 9 Torr or less. When the pressure became to 13 and 15 Torr, fine delamination with a diameter of 0.1 mm or less was observed in several portions. When the pressure became larger than that, further larger delaminations were observed. This means that in order to obtain good adhesiveness, the shrinkage of film thickness at the time of oxidation is made preferably 14% or less, more preferably 10% or less. Further, in order to produce the film by the above-mentioned method, it is preferable to make the (pressure in the reactor)·(volume in the reactor)/(total gas flow rate) 500 Torr.sec or less, more preferably 280 Torr.sec or less.

EXAMPLE 3

Films were produced by changing the liquid source materials to study material dependency of the film quality. When two liquid sources were used, two bubblers which controled the bubbler temperature and the He flow rate independently. By this, the total flow rate of the carrier He was adjusted to be 200 sccm and the vapor amount of the liquid source in the carrier was controlled to be the same as that in Example 1. Forming conditions other than those mentioned above were the same as those of Example 1.

The vapor amount of liquid source in 200 sccm of the carrier gas is shown below (relative values taking the vapor amount of Example 1 as 1).

| (a) | $Si(OC_2H_5)_4$ | 1 |
|---|---|---|
| (b) | $Si(OC_2H_5)_4$ | 0.25 |
|   | $CH_3Si(OC_2H_5)_3$ | 0.75 |
| (c) | $CH_3Si(OC_2H_5)_3$ | 1 |
| (d) | $CH_3Si(OC_2H_5)_3$ | 0.5 |
|   | $(CH_3)_2Si(OC_2H_5)_2$ | 0.5 |
| (e) | $(CH_3)_2Si(OC_2H_5)_2$ | 1 |

When the above-mentioned formulae are represented by the formula: $(CH_3)_n Si(OC_2H_5)_{4-n}$, n in (a) to (e) corresponds to (a) n=0, (b) n=0.5, (c) n=1, (d) n=1.5 and (e) n=2.

Figure 13:
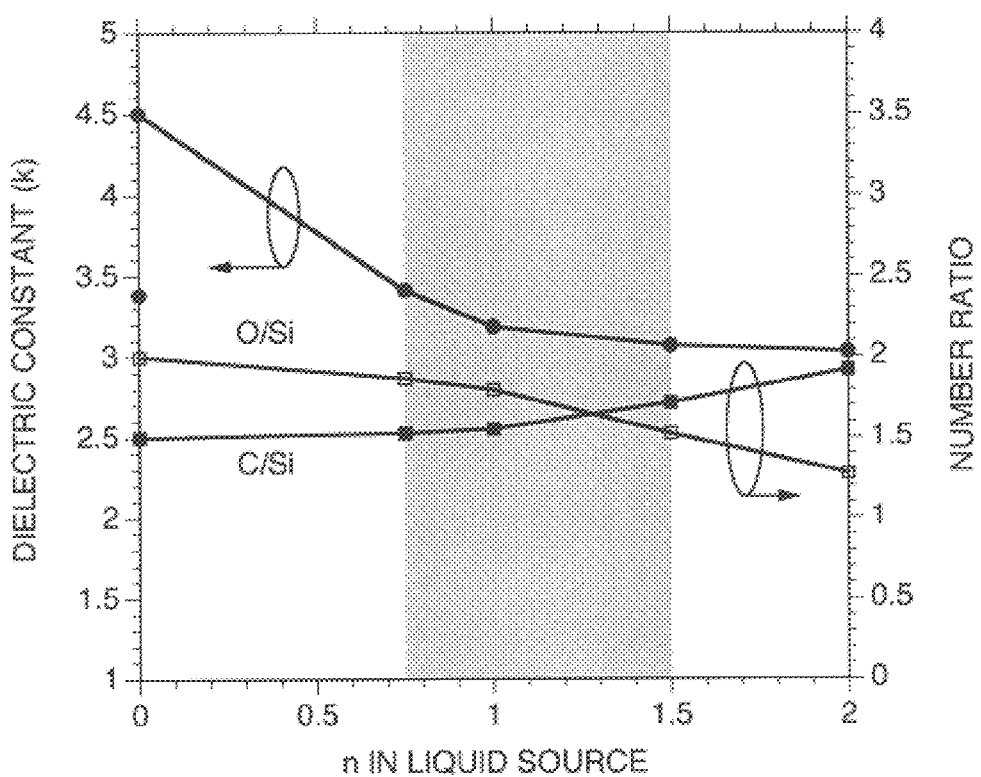
FIG. 13 is a graph showing the n dependency of dielectric constants and the number ratio of atoms obtained in Example 3 of the present invention.

FIG. 13 is a graph showing relations between the dielectric constant and O/Si ratio, C/Si ratio, and n. As is clear from FIG. 13, in order to realize the dielectric constant of 3.5 or less, the O/Si ratio of 1.5 or more and the C/Si ratio of 1 to 2, n is 0.75 or more and 1.5 or less.

Further, the above films (n=0.75–1.5) were subjected to the high-pressure oxygen plasma treatment using a barrel type asher. The treatment conditions were the same as those of Example 1. The change of film thickness measured by ellipsometry was less than 10% in each case.

EXAMPLE 4

Using the film of Example 1, a multilevel wiring in a semiconductor device was prepared. Copper wiring was formed by using a single damascene process.

Figure 14:
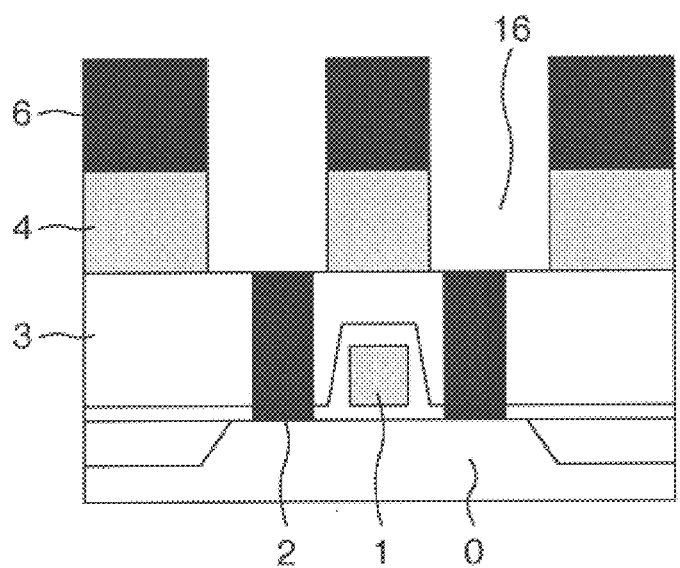
FIGS. 14 to 23 are cross-sectional views explaining the process of Example 4 of the present invention.
Figure 15:
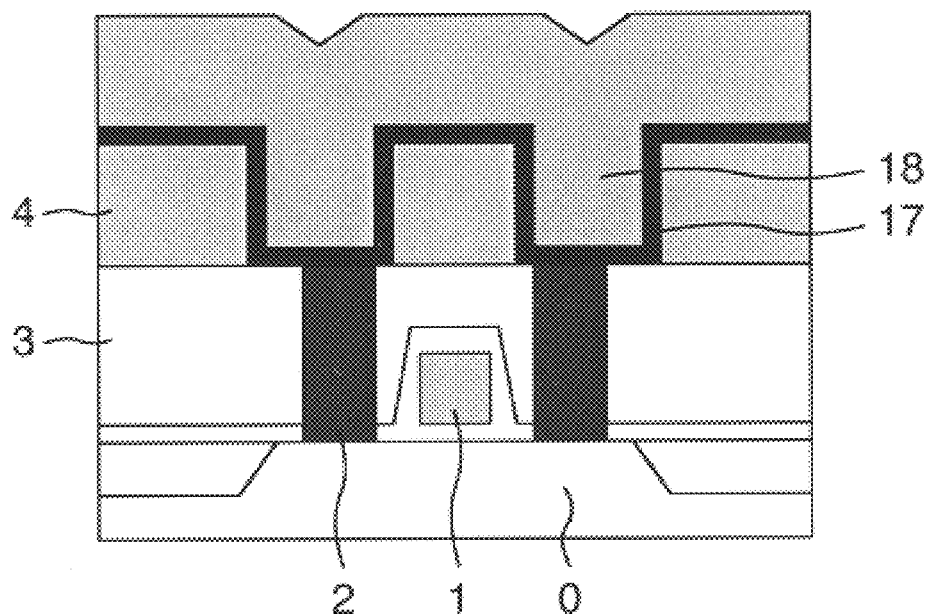
Figure 16:
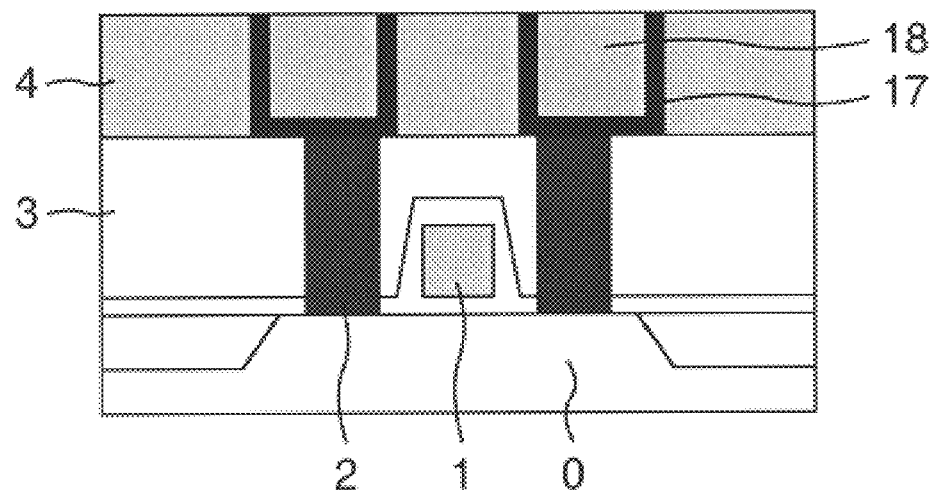

On a semiconductor substrate 0 having a gate electrode of transistor 1 and a contact electrode 2 thereon, the film 4 of Example 1 was formed in 300 nm thick, and a trench pattern 16 corresponding to a first level wiring was formed (FIG. 14). After removing a resist 6 using a low pressure oxygen reactive ion etching at a pressure of 10 mTorr, titanium nitride 17 in 500 nm thick and copper 18 in 100 nm thick were formed by sputtering, followed by filling of copper in the pattern using electroplating (FIG. 15). Then, the copper and titanium nitride outside the pattern were removed by CMP to give the first level wiring (FIG. 16).

Figure 17:
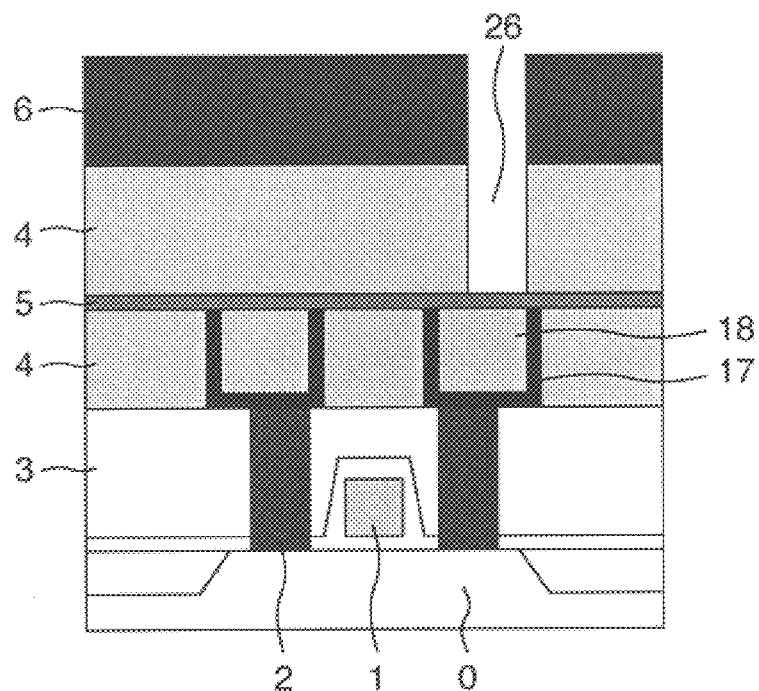
Figure 18:
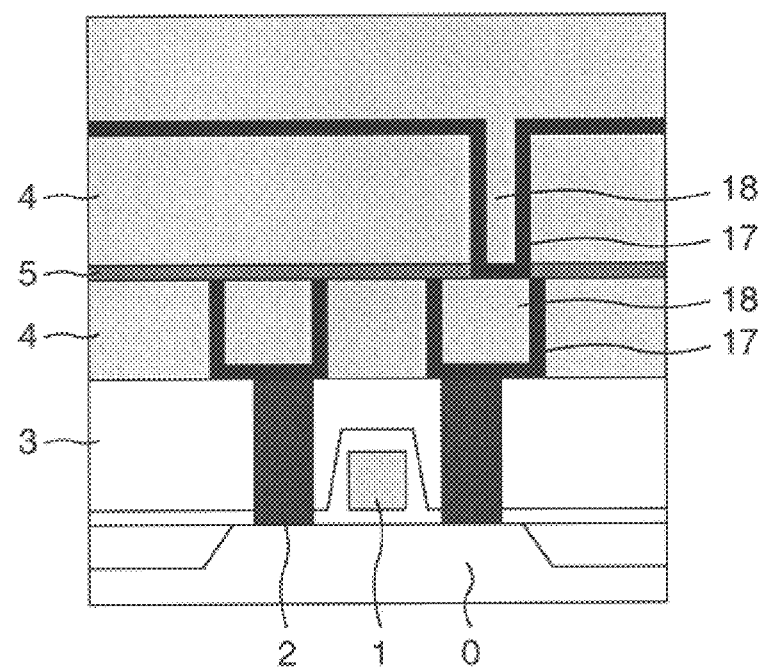
Figure 19:
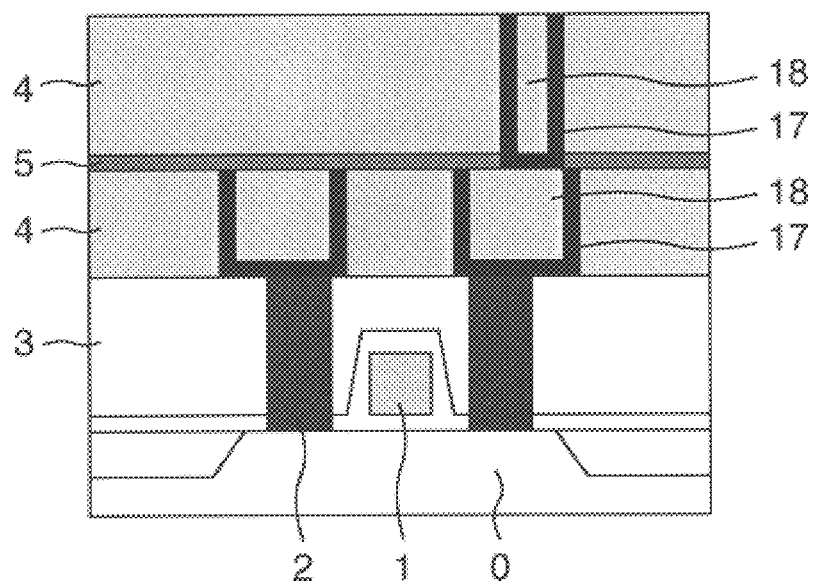

Then, a silicon nitride film 5 in 50 nm thick and the film 4 of Example 1 in 400 nm thick were formed, followed by formation of hole pattern 26 corresponding to via connection (FIG. 17). At this time, the etching was stopped on the silicon nitride so as not to expose the copper. After removing the resist by a low pressure oxygen reactive ion etching at a pressure of 10 mTorr, the silicon nitride retaining at the bottom of the hole was subjected to etching to expose the copper. Then, after forming titanium nitride 17 in 50 nm thick and copper 18 in 100 nm thick by sputtering, copper was filled in the pattern by electroplating (FIG. 18). Further, the copper and titanium nitride outside pattern were removed by CMP to give via connection (FIG. 19).

Figure 20:
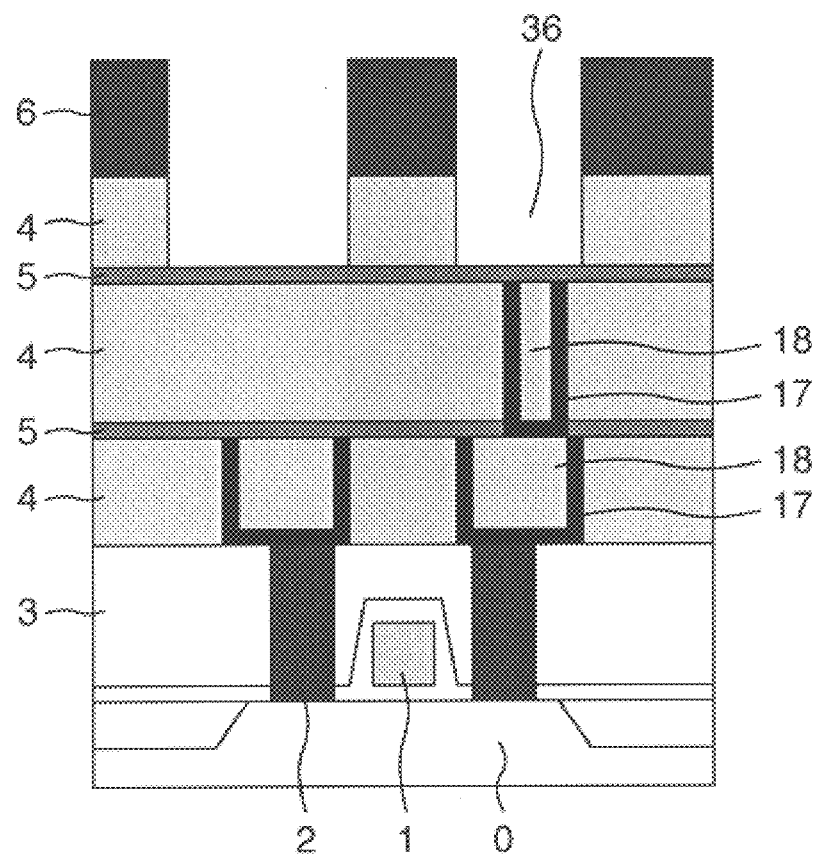
Figure 21:
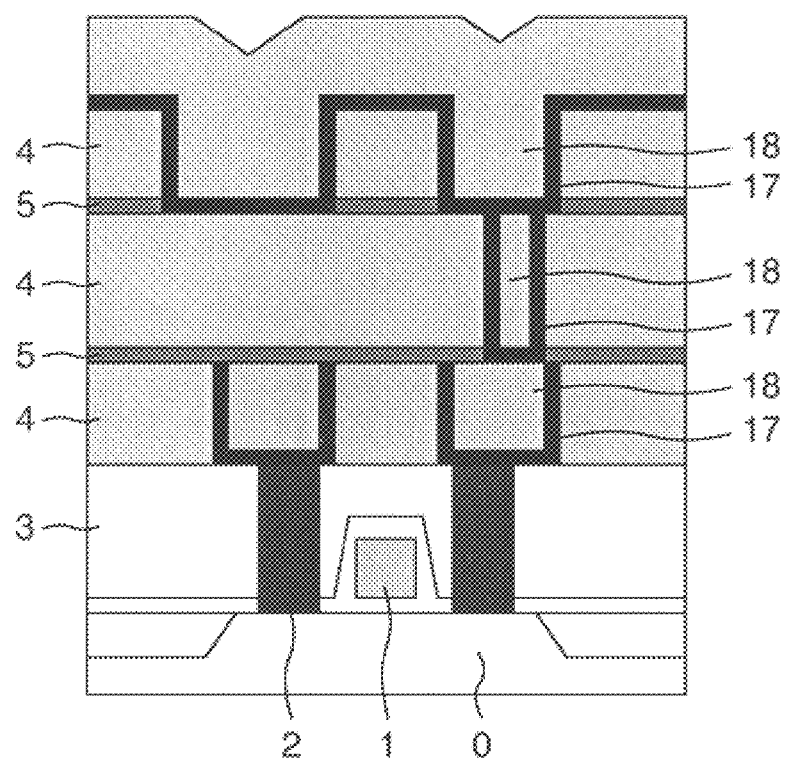
Figure 22:
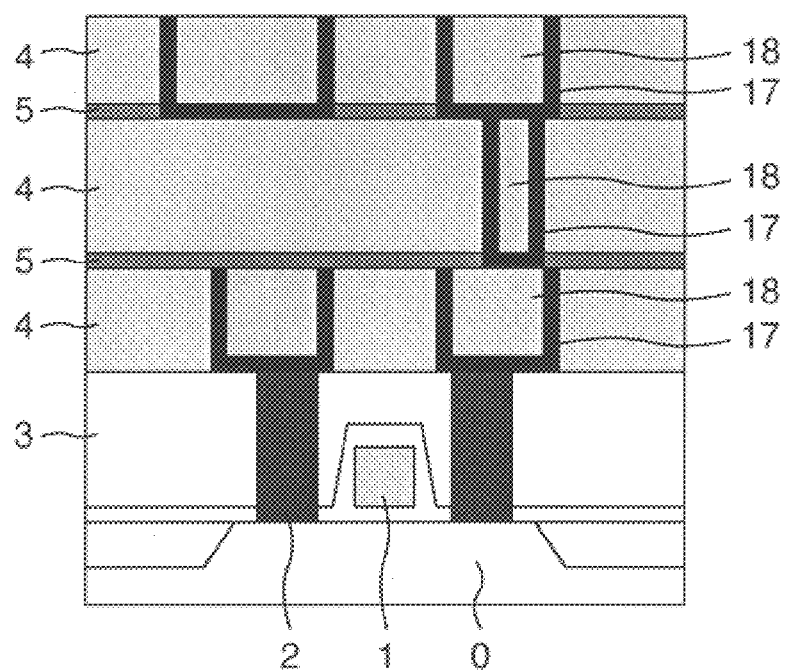

Then, a silicon nitride film 5 in 50 nm thick and the film 4 of Example 1 in 250 nm thick were formed, followed by formation of a trench pattern 36 corresponding to a second level wiring (FIG. 20). The etching was conducted in the same manner as mentioned above. After removing the resist using a low pressure oxygen reactive ion etching at a pressure of 10 mTorr, the silicon nitride retaining at the bottom of the trench was etched to expose the copper. Then, titanium nitride 17 in 50 nm thick and copper 18 in 100 nm thick were formed by sputtering, followed by filling of copper in the pattern using electroplating (FIG. 21). Further, the copper and titanium nitride outside the pattern were removed by CMP to form the second level wiring (FIG. 22).

Figure 23:
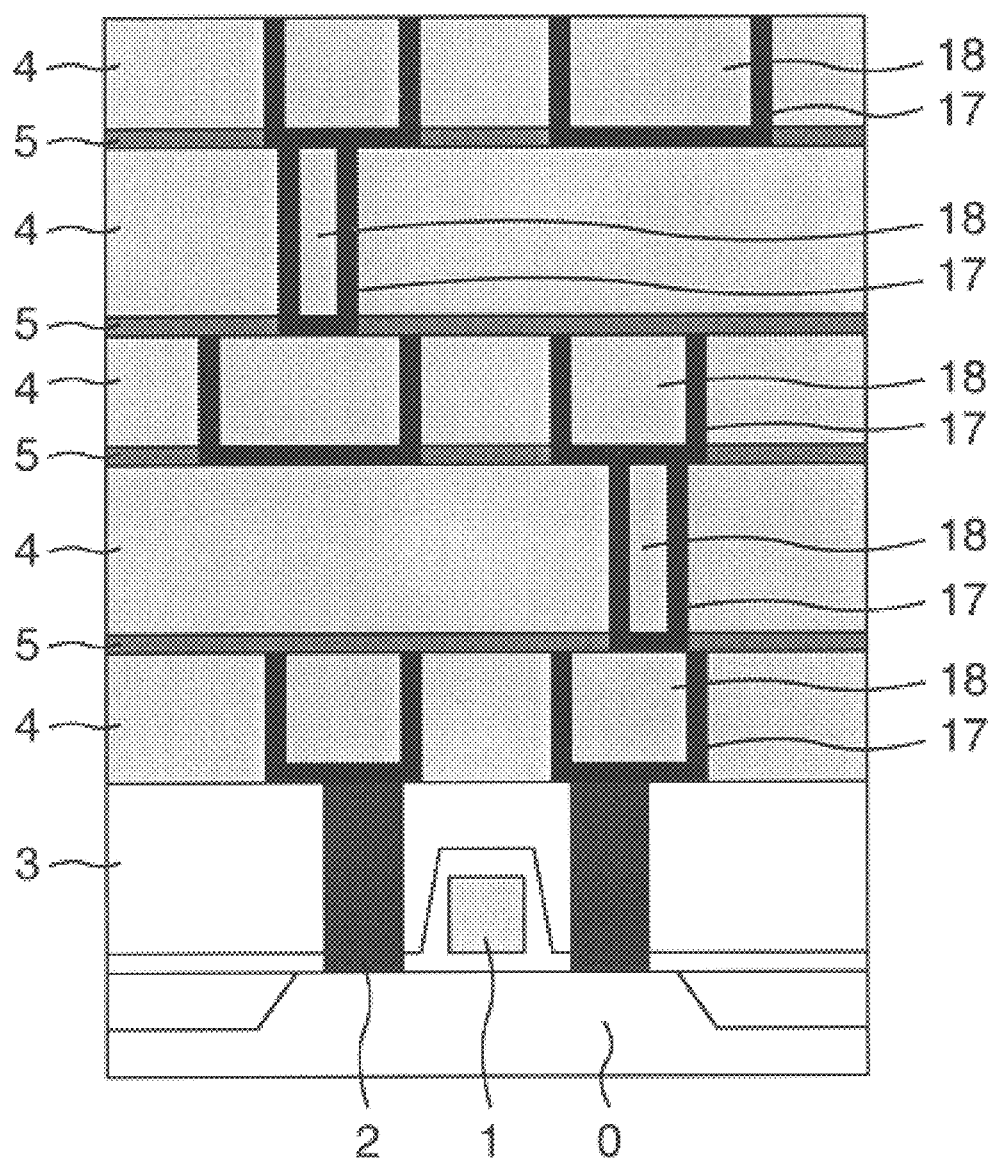

Then, repeating the same treatments as shown in FIGS. 17 to 22, a third level wiring was formed (FIG. 23).

In all the steps mentioned above, there arose no problem of delamination.

For comparison, a sample using a silicon oxide protective film of 100 nm thick was also prepared. The film thickness of the film of Example 1 was reduced in 100 nm in all the level wiring so as to make the wiring height and the via height the same. When an effective dielectric constant in the second level wiring and that between upper and lower level wiring was measured, the effective dielectric constant was about 10% lower than the case of not using the silicon oxide protective film.

EXAMPLE 5

Multilevel wiring of a semiconductor device was prepared by using the film of Example 1 and an organic polymer film (a trade name SiLK, mfd. by Dow Chemical Co., dielectric constant 2.7). The copper wiring was formed by a single damascene process.

Figure 24:
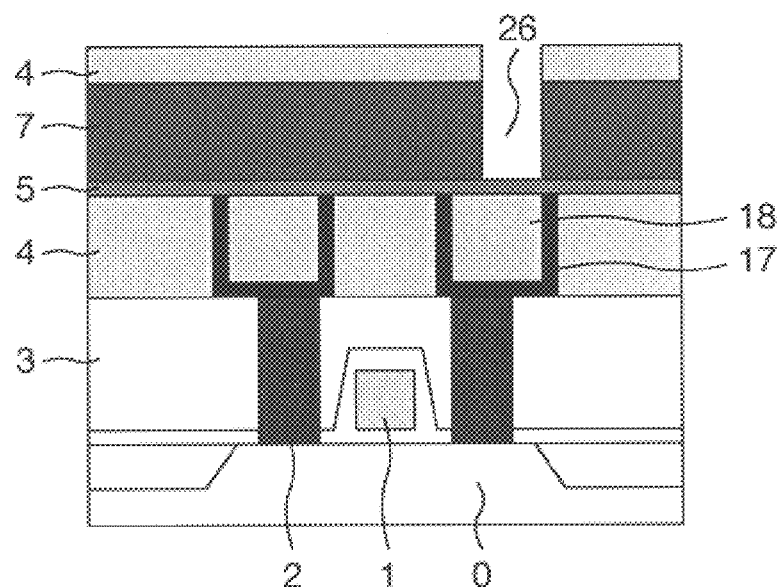
FIGS. 24 to 30 are cross-sectional views explaining the process of Example 5 of the present invention.
Figure 25:
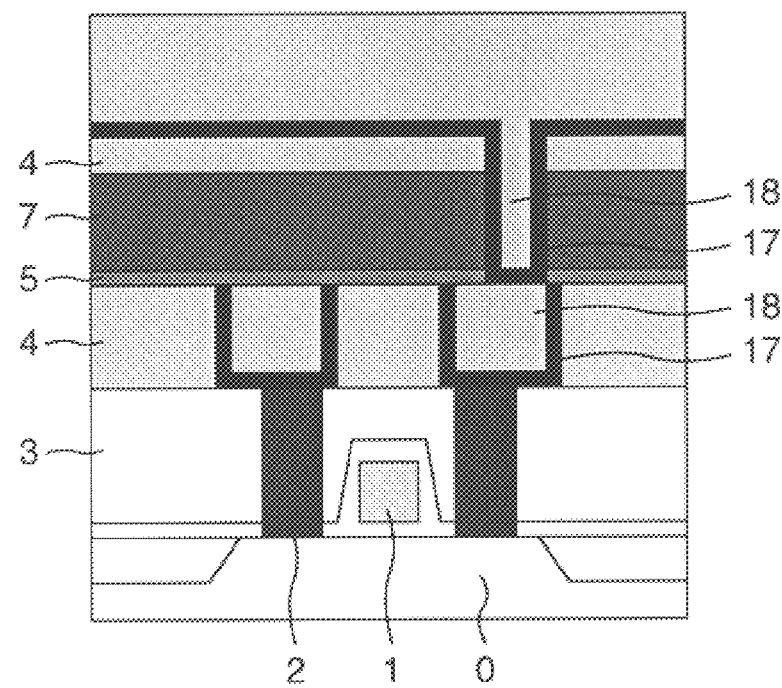
Figure 26:
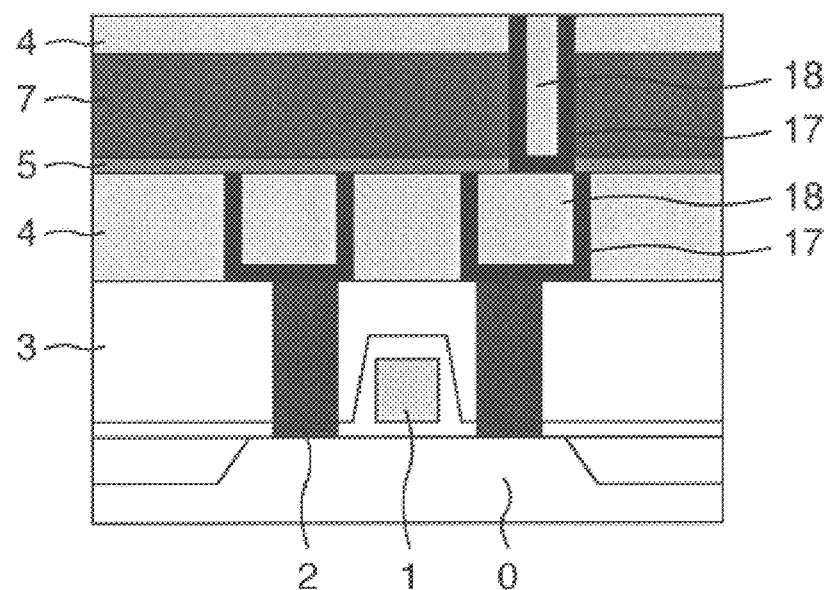

After the step shown in FIG. 16, a silicon nitride film 5 in 50 nm thick and an organic polymer film 7 in 300 nm thick, and the film 4 of Example 1 in 100 nm thick were formed, followed by formation of a hole pattern 26 corresponding to the via connection (FIG. 24). At this time, the film of Example 1 was etched first, followed by simultaneous etching of the organic polymer film using this as a hard mask. The simultaneous etching was conducted by using a mixed gas of oxygen and nitrogen and low pressure reactive ion etching. Then, the silicon nitride retaining at the bottom of hole was etched to expose the copper. Then, titanium nitride 17 in 50 nm thick and copper 18 in 100 nm thick were formed by sputtering, followed by filling of copper in the pattern by electroplating (FIG. 25). Further, after removing the copper and titanium nitride outside the pattern by CMP, via connection was formed (FIG. 26). At this time, no problem of delamination arose.

Figure 27:
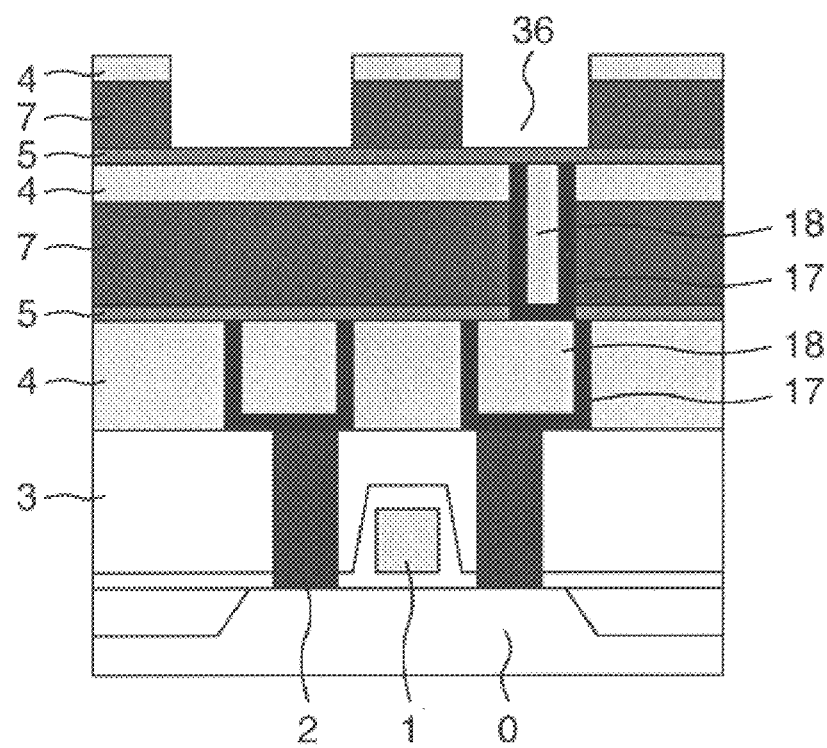
Figure 28:
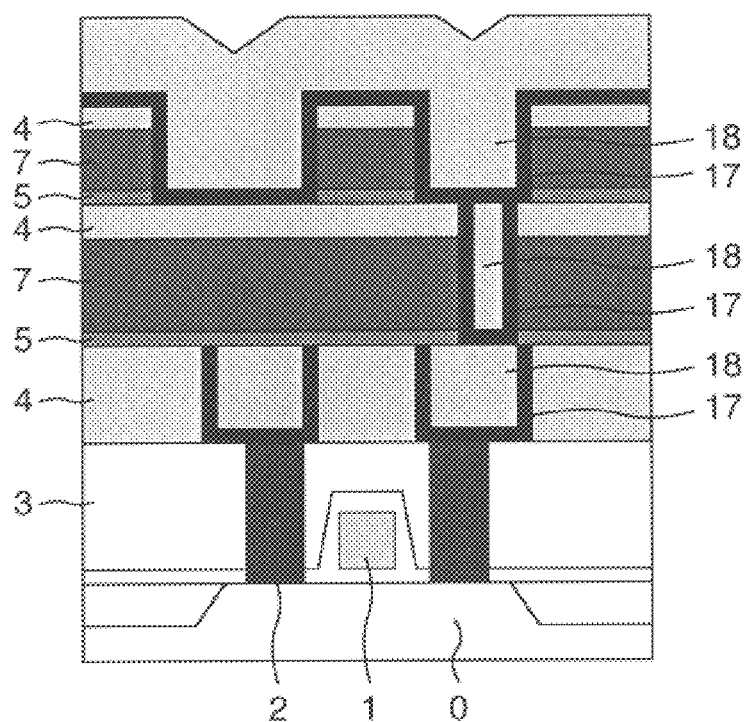
Figure 29:
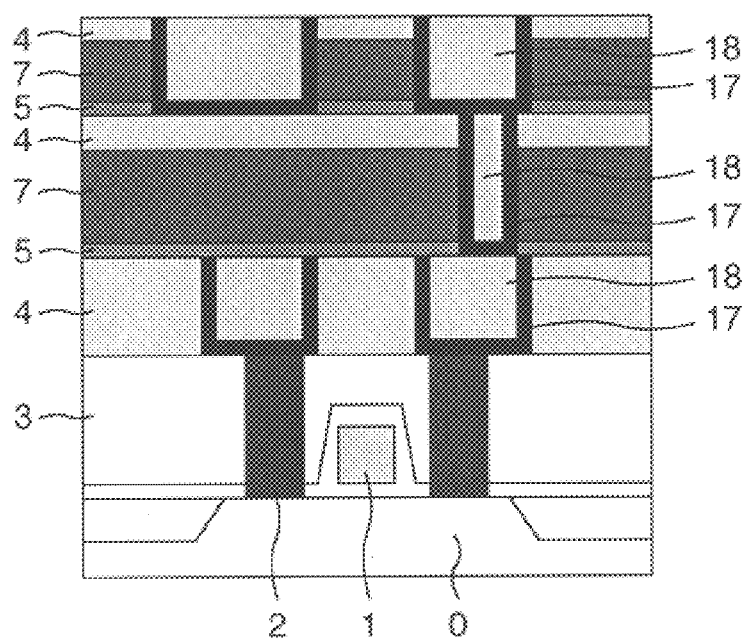

Then, a silicon nitride film 5 in 50 nm thick, an organic polymer film 7 in 150 nm thick, and the film 4 of Example 1 in 100 nm thick were formed, followed by formation of a trench pattern 36 corresponding to the second level wiring (FIG. 27). The etching was conducted in the same manner as mentioned above. Then, the silicon nitride retaining at the bottom of trench was etched to expose the copper. Then, titanium nitride 17 in 50 nm and copper 18 in 100 nm thick were formed by sputtering, and the pattern was filled with copper using electroplating (FIG. 28). Further, the copper and titanium nitride outside the pattern were removed by CMP to form the second level wiring (FIG. 29).

Figure 30:
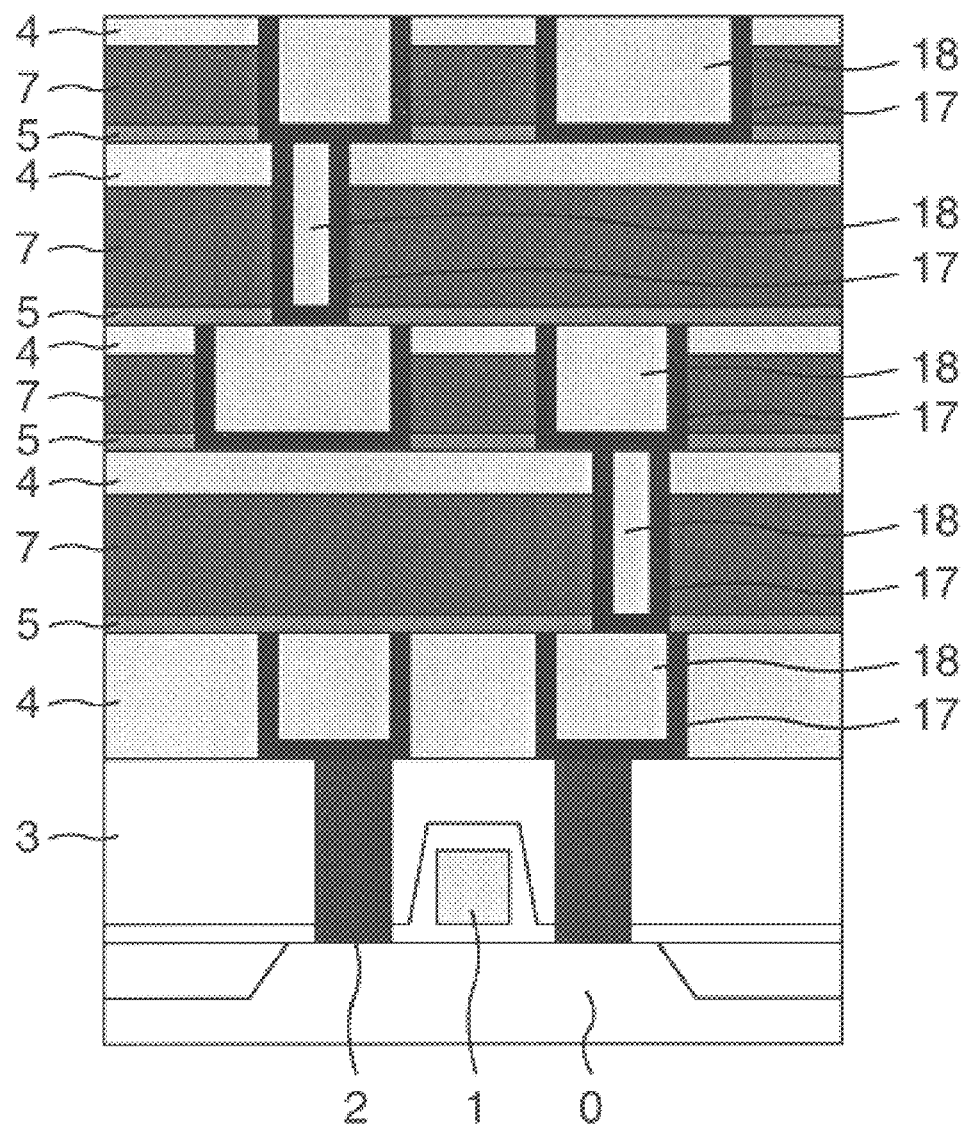

Then, repeating the same treatments as shown in FIGS. 24 to 29, a third level wiring was formed (FIG. 30).

In all the steps mentioned above, no problem caused by delamination took place.

For comparison, a sample using a silicon oxide protective film of 100 nm thick was also prepared. The film thickness of the film of Example 1 was reduced in 100 nm in all the level wiring so as to make the wiring height and the via connection height the same. When an effective dielectric constant in the second level wiring and that between upper and lower level wiring was measured, the effective dielectric constant was about 10% lower than the case of not using the silicon oxide protective film.

EXAMPLE 6

Multilevel wiring of a semiconductor device was prepared by using the film of Example 1. The copper wiring was formed by a dual damascene process having less steps compared with a single damascene process.

Figure 31:
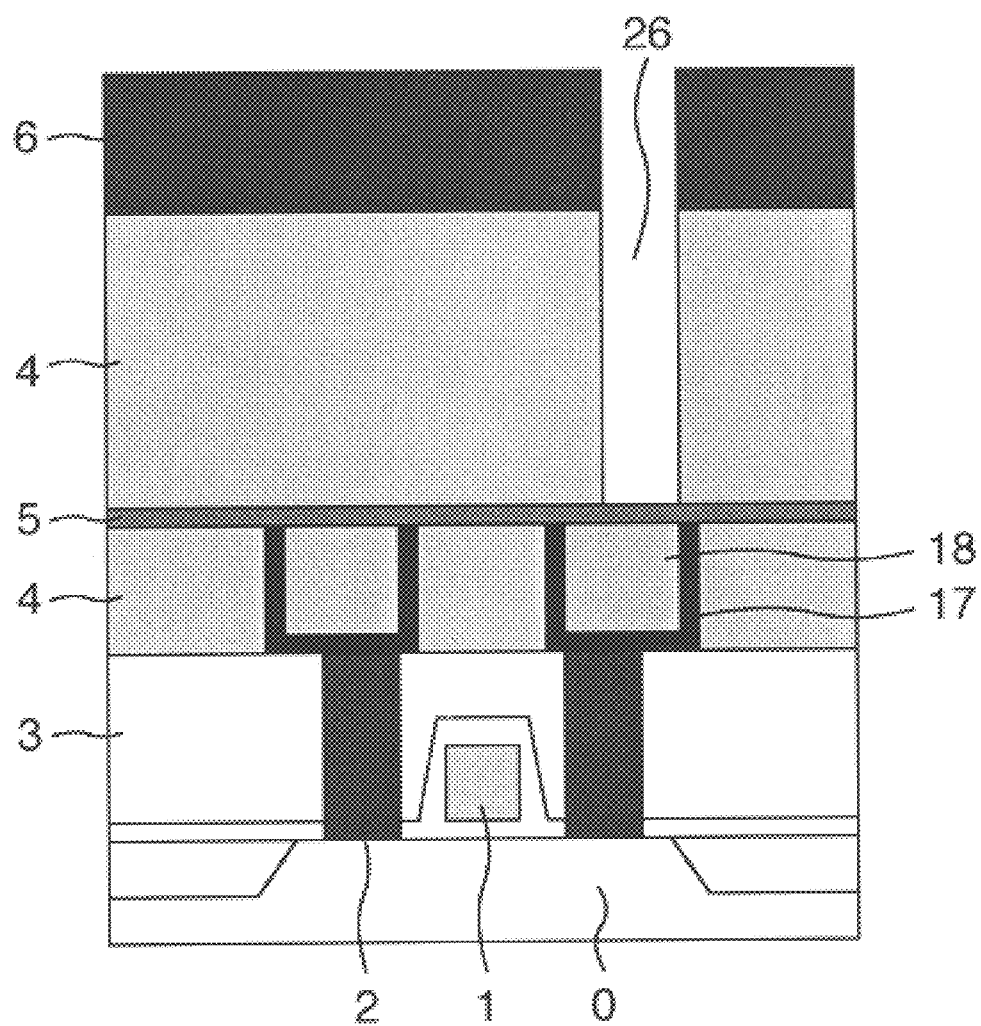
FIGS. 31 to 35 are cross-sectional views explaining the process of Example 6 of the present invention.
Figure 32:
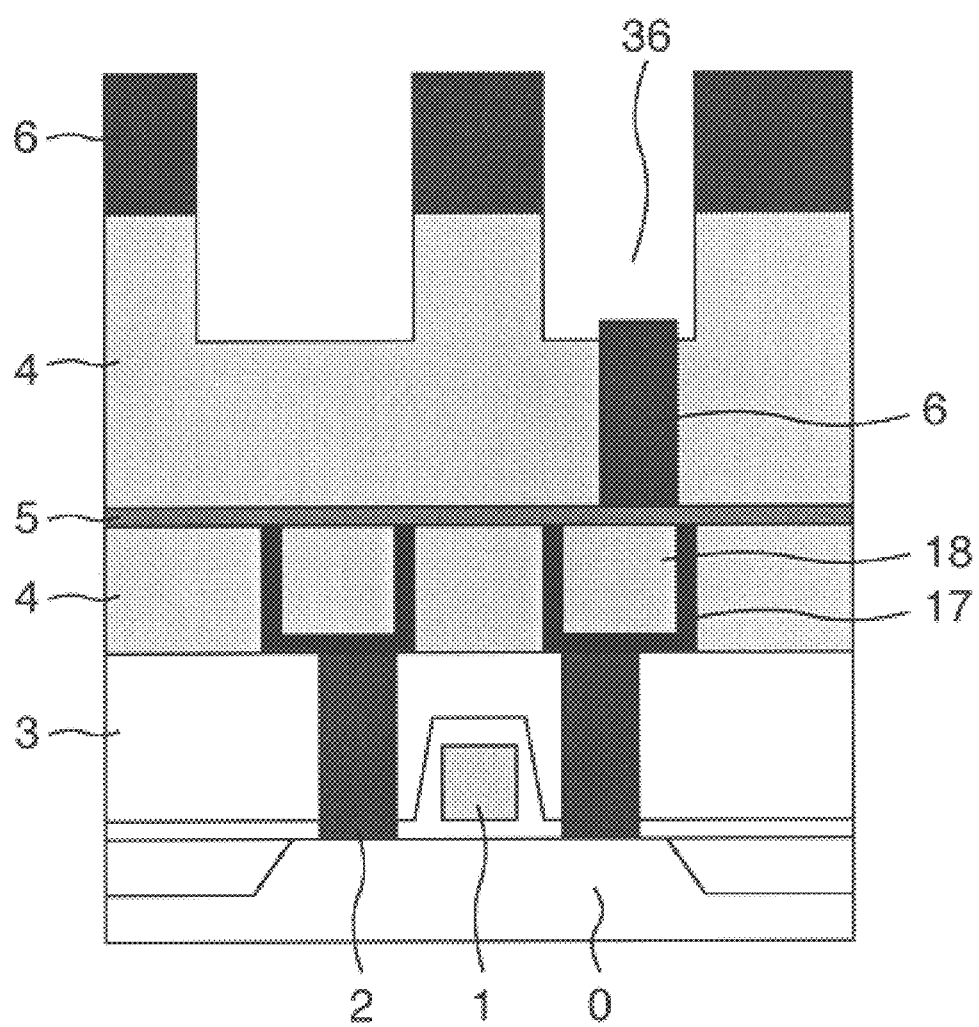
Figure 33:
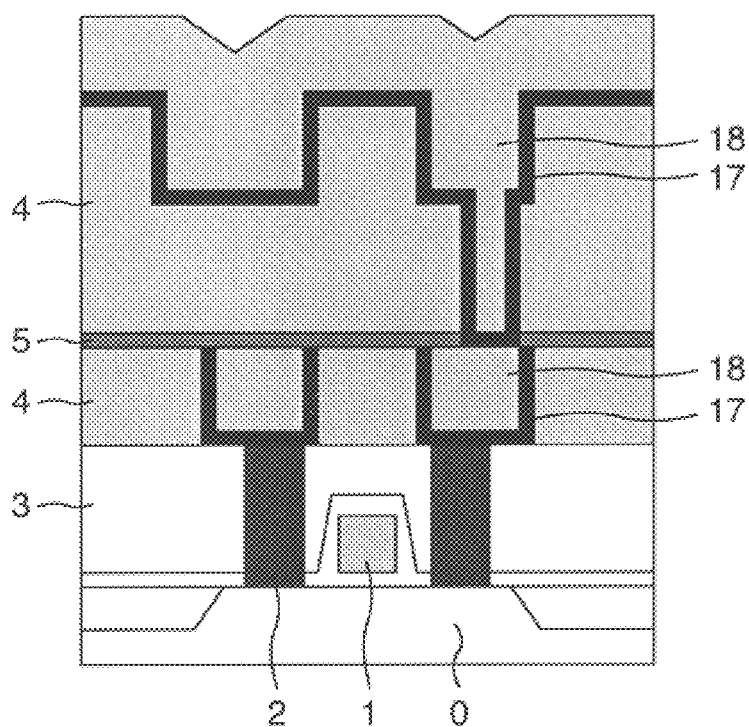
Figure 34:
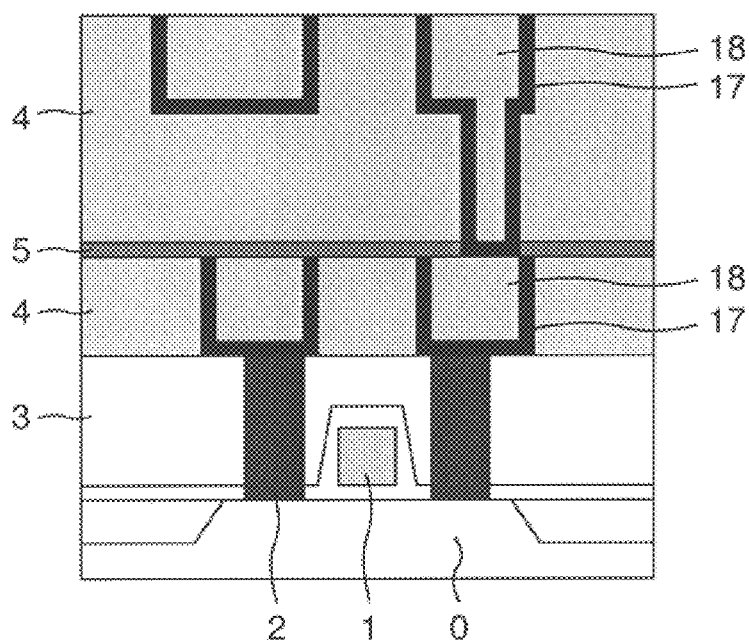

After the step shown in FIG. 16, a silicon nitride film 5 in 50 nm thick and the film 4 of Example 1 in 700 nm thick were formed, followed by formation of a hole pattern 26 corresponding to the via connection (FIG. 31). At this time, the etching was stopped on the silicon nitride so as not to expose the copper. After removing the resist using a low pressure oxygen reactive ion etching at a pressure of 10 mTorr, a trench pattern 36 corresponding to a second level wiring was formed (FIG. 32). After removing the resist 6 using a low pressure oxygen reactive ion etching at a pressure of 10 mTorr, the silicon nitride retaining at the bottom of hole was etched to expose the copper. Then, titanium nitride 17 in 50 nm thick and copper 18 in 100 nm thick were formed by sputtering, followed by filling of copper in the pattern by electroplating (FIG. 33). Further, after removing the copper and titanium nitride outside the pattern by CMP, via connection and a second level wiring were formed (FIG. 34).

Figure 35:
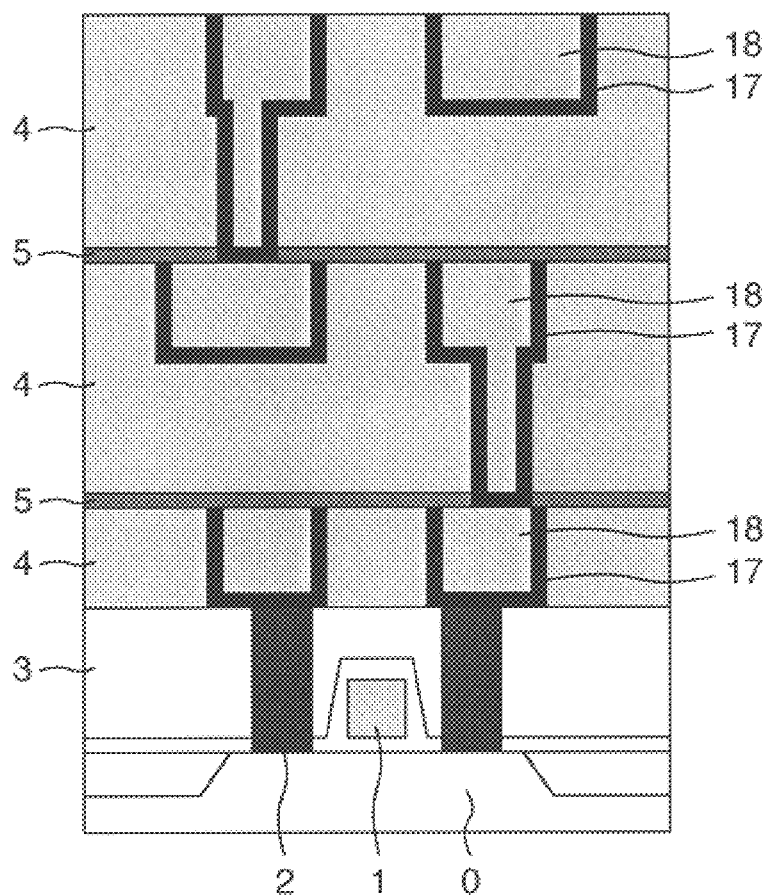

Then, repeating the same treatments as shown in FIGS. 31 to 34, a third level wiring was formed (FIG. 35).

In all the steps mentioned above, no problem caused by delamination took place.

EXAMPLE 7

Using the film of Example 1, a multilevel wiring in a semiconductor device was prepared. Aluminum alloy wiring was formed by a dry etching process.

Figure 36:
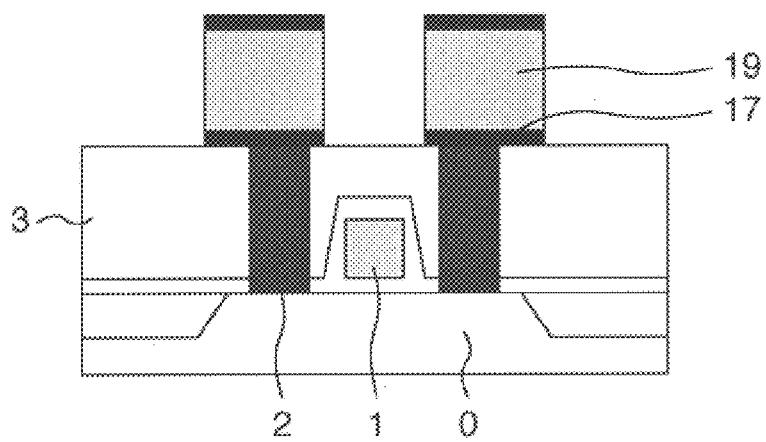
FIGS. 36 to 41 are cross-sectional views explaining the process of Example 7 of the present invention.

First, on a semiconductor substrate 0 have a gate electrode of transistor 1 and a contact electrode 2 thereon, titanium nitride 17 in 50 nm thick, aluminum alloy 19 in 300 nm thick and titanium nitride 17 in 50 nm thick were formed. Then, a first level wiring was formed by photolithography and dry etching, followed by removal of the resist (FIG. 36).

Figure 37:
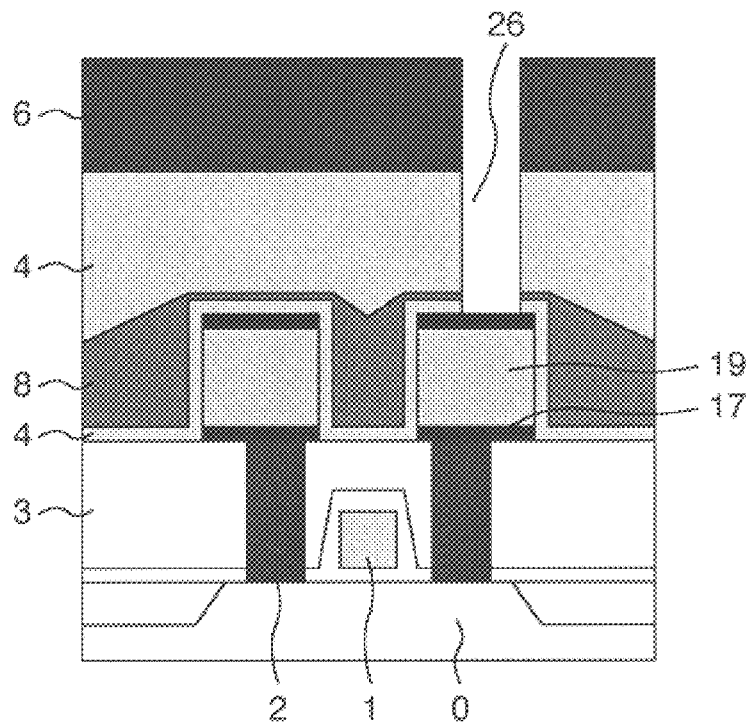
Figure 38:
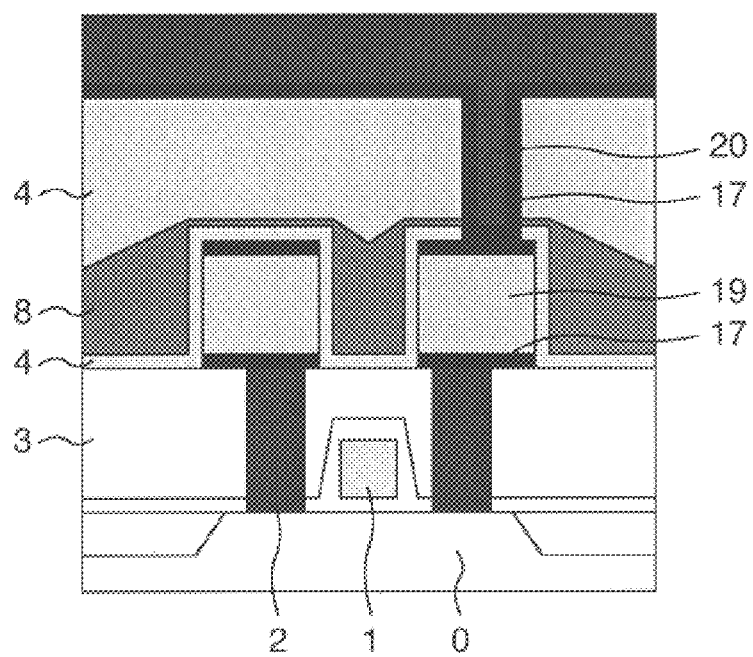
Figure 39:
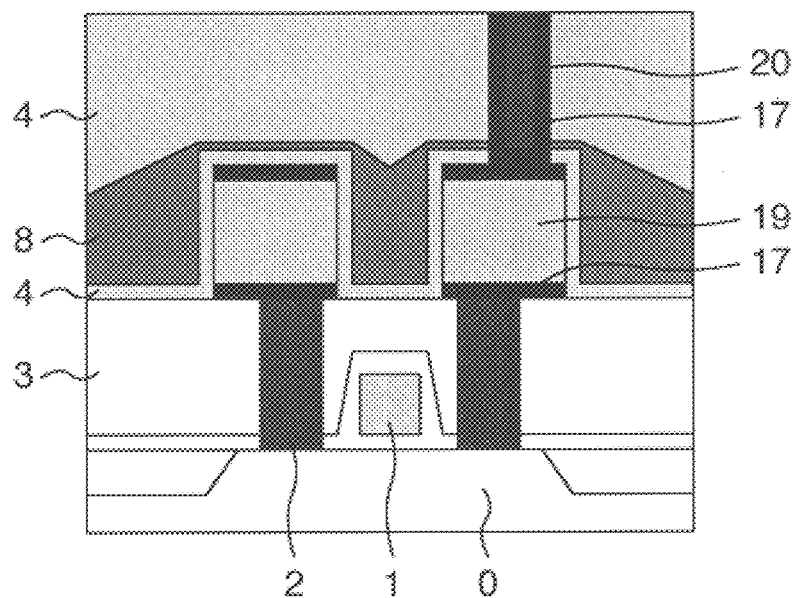
Figure 40:
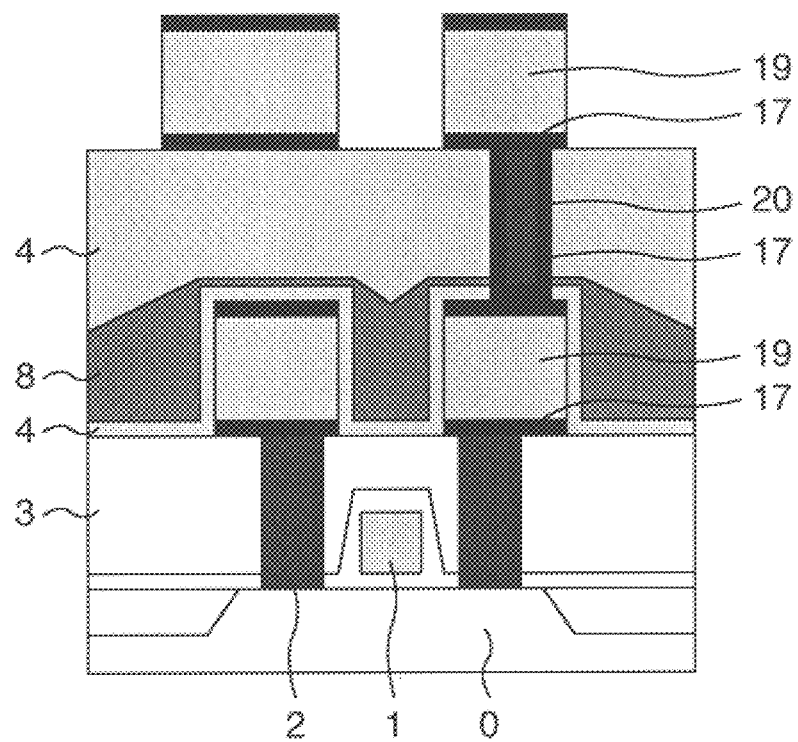

After forming the film of Example 1 in 50 nm thick, a trench was filled with an organic spin-on glass (a trade name, HSG-R7, mfd. by Hitachi Chemical Company, Ltd.) in 250 nm thick, followed by formation of the film of Example 1 in 1000 nm thick. After planarizing the surface by CMP, a hole pattern 26 corresponding to a via connection was formed (FIG. 37). After removing the resist 6 using a low pressure oxygen reactive ion etching at a pressure of 10 mTorr, titanium nitride 17 in 50 nm thick was formed by sputtering and tungsten 20 in 300 nm thick was formed by CVD method to fill the hole (FIG. 38). Further, the tungsten and titanium nitride outside the pattern were removed by CMP to form via connection (FIG. 39). Then, titanium nitride in 50 nm thick, aluminum alloy in 300 nm thick and titanium nitride in 50 nm thick were formed. A second level wiring was formed by photo-lithography and dry etching, followed by removal of resist (FIG. 40). At this time, a low pressure oxygen reactive ion etching at a pressure of 10 mTorr was used for removal of the resist.

Figure 41:
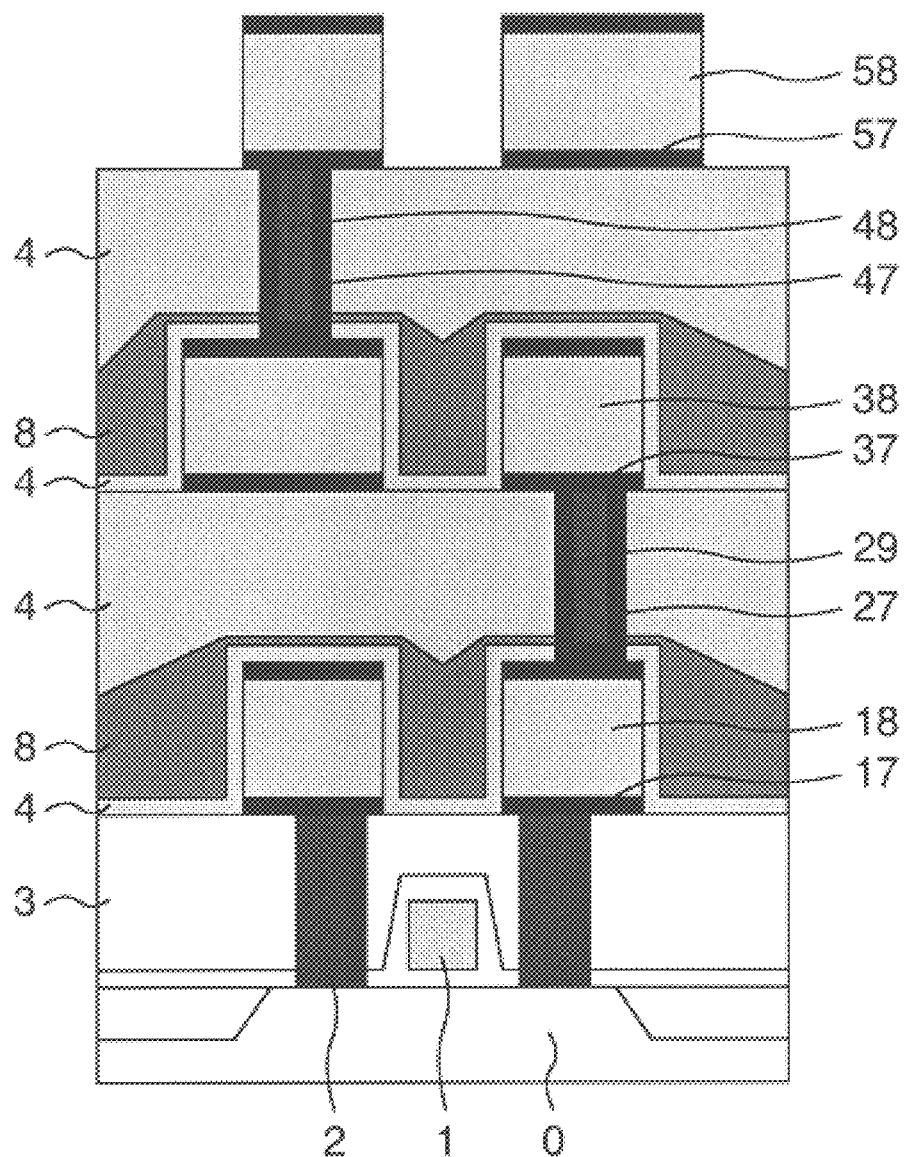

Repeating the same treatments as shown in FIGS. 37 to 40, a third level wiring was formed (FIG. 41). In FIG. 41, numerals 27, 37, 47 and 57 denote a barrier metal, numerals 29 and 48 denote tungsten, and numerals 38 and 58 denote aluminum alloy, respectively.

In the all steps mentioned above, no problems caused by delamination took place.

For comparison, a sample using a silicon oxide film in place of the film of Example 1 was also prepared. When an effective dielectric constant in the second level wiring and that between upper and lower level wiring was measured, the effective dielectric constant was about 10% between neighboring wiring and 20% between upper and lower levels lower than the case of not using the silicon oxide film.

When the low dielectric insulating film forming holes or trench patterns therein is subjected to formation of a metal film directly, followed by polishing, the metal film is not delaminated. This is because the shrinkage on the surface of the insulating film caused by removal of resist after pattern formation is small.

Therefore, when a conventional stacked film comprising a low dielectric constant film and a silicon oxide protective film is replaced by the low dielectric constant film of the present invention, the manufacturing steps are reduced, and an increase of effective dielectric constant due to the silicon oxide film can be prevented. Further, when the low dielectric constant film of the present invention is used as a protective film for another low dielectric constant insulting film, an increase of effective dielectric constant due to the silicon oxide film can also be reduced.

What is claimed is:

1. A process for producing a semiconductor device comprising
    a step of forming an intermetal insulating film using a mixed gas comprising a vapor of monomethyltriethoxysilane represented by the formula: $RSi(OR')_3$, wherein R is a methyl group and R' is an ethyl group, and a non-oxidizing gas by means of a plasma chemical vapor deposition method, and
    a step of forming wires.

2. A process according to claim 1, wherein the non-oxidizing gas is a nitrogen gas, a hydrogen gas, an ammonia gas, a helium gas, an argon gas or a mixture thereof.

3. A process according to claim 1, wherein the non-oxidizing gas is a mixture of a nitrogen gas and an inert gas.

4. A process according to claim 1, wherein the intermetal insulating film is formed under a condition of (pressure in a reactor)·(volume of the reactor)/(total gas flow rate) of 500 Torr.sec or less.

5. A process according to claim 4, wherein the intermetal insulating film is formed under a condition of (pressure in a reactor)·(volume of the reactor)/(total gas flow rate) of 280 Torr.sec or less.

6. A process for producing a semiconductor device which comprises
    a step of forming an intermetal insulating film using a mixed gas comprising a vapor of methylethoxysilane represented by the formula: $R_nSi(OR')_{4-n}$, wherein R is a methyl group, R' is an ethyl group, and n is 0 to 2, said vapor being mixed so as to make R 0.75 to 1.5 per silicon, and a non-oxidizing gas by means of a plasma chemical vapor deposition method, and
    a step of forming wires.

7. A process according to claim 6, wherein the non-oxidizing gas is a nitrogen gas, a hydrogen gas, an ammonia gas, a helium gas, an argon gas or a mixture thereof.

8. A process according to claim 6, wherein the non-oxidizing gas is a mixture of a nitrogen gas and an inert gas.

9. A process according to claim 6, wherein the intermetal insulating film is formed under a condition of (pressure in a reactor)·(volume of the reactor)/(total gas flow rate) of 500 Torr.sec or less.

10. A process according to claim 9, wherein the intermetal insulating film is formed under a condition of (pressure in a reactor)·(volume of the reactor)/(total gas flow rate) of 280 Torr.sec or less.

11. A process for producing a semiconductor device which comprises
    a step of forming an intermetal insulating film using a mixed gas comprising (a) a vapor of monomethyltriethoxysilane represented by the formula: RSi(OR')$_3$, wherein R and R' are each methyl group, or (b) a vapor of methylmethoxysilane represented by the formula: R$_n$Si(OR')$_{4-n}$, wherein R and R' are each methyl group, and n is 0 to 2, said vapor being mixed so as to make R 0.75 to 1.5 per silicon, and a non-oxidizing gas by means of a plasma chemical vapor deposition method, and a step of forming wires.

12. A process according to claim 11, wherein the non-oxidizing gas is a nitrogen gas, a hydrogen gas, an ammonia gas, a helium gas, an argon gas or a mixture thereof.

13. A process according to claim 11, wherein the non-oxidizing gas is a mixture of a nitrogen gas and an inert gas.

14. A process according to claim 11, wherein the intermetal insulating film is formed under a condition of (pressure in a reactor)·(volume of the reactor)/(total gas flow rate) of 500 Torr.sec or less.

15. A process according to claim 14, wherein the intermetal insulating film is formed under a condition of (pressure in a reactor)·(volume of the reactor)/(total gas flow rate) of 280 Torr.sec or less.

16. A process for producing a semiconductor device which comprises a step forming an intermetal insulating film containing at least silicon atoms, oxygen atoms, and carbon atoms with the number ratio of oxygen atom to silicon atom being 1.5 or more and the number ratio of carbon atom to silicon atom being 1 to 2, and having a shrinkage in the film thickness direction at a time of oxidation of 14% or less, a step of forming one or more trenches or holes in the intermetal insulating film, a step of depositing a metal film so as to fill the trenches or holes, and a step of removing the metal film from portions other than insides of the trenches or holes by chemical-mechanical polishing process.

17. A process according to claim 16, which further comprises a step of exposing the intermetal insulting film to plasma containing oxygen under a pressure of 50 mTorr or less.

18. A process for producing a semiconductor device which comprises a step forming an intermetal insulating film containing at least silicon atoms, oxygen atoms, and carbon atoms with the number ratio of oxygen atom to silicon atom being 1.5 or more and the number ratio of carbon atom to silicon atom being 1 to 2, and having a shrinkage in the film thickness direction at a time of oxidation of 10% or less, a step of forming one or more trenches or holes in the intermetal insulating film, a step of depositing a metal film so as to fill the trenches or holes, and a step of removing the metal film from portions other than insides of the trenches or holes by chemical-mechanical polishing process.

19. A process according to claim 18, which further comprises a step of exposing the intermetal insulting film to plasma containing oxygen under a pressure of 50 mTorr or less.

20. A process for producing a semiconductor device which comprises a step of forming a first wire by dry etching of a metal film, a step of forming a first insulating film containing at least silicon atoms, oxygen atoms, and carbon atoms with the number ratio of oxygen atom to silicon atom being 1.5 or more and the number ratio of carbon atom to silicon atom being 1 to 2, and having a shrinkage in the film thickness direction at a time of oxidation of 14% or less, a step of forming a coated insulating film, a step of forming a second insulating film containing at least silicon atoms, oxygen atoms and carbon atoms with the number ratio of oxygen atom to silicon atom being 1.5 or more and the number ratio of carbon atom to silicon atom being 1 to 2, and having a shrinkage in the film thickness direction at a time of oxidation of 14% or less, a step of forming holes in a stack comprising the first insulating film, the coated insulating film and the second insulating film so as to expose a surface of the first wire, a step of filling a metal film in the holes, and a step of removing the metal film from outside of the holes.

21. A process according to claim 20, which further comprises a step of removing a resist used for forming the holes by a plasma treatment containing at least oxygen under a pressure of 50 mTorr or less between the step of forming the holes and the step of filling the metal film in the holes.

22. A process for producing a semiconductor device which comprises a step of forming a first wire by dry etching of a metal film, a step of forming a first insulating film containing at least silicon atoms, oxygen atoms, and carbon atoms with the number ratio of oxygen atom to silicon atom being 1.5 or more and the number ratio of carbon atom to silicon atom being 1 to 2, and having a shrinkage in the film thickness direction at a time of oxidation of 10% or less, a step of forming a coated insulating film, a step of forming a second insulating film containing at least silicon atoms, oxygen atoms and carbon atoms with the number ratio of oxygen atom to silicon atom being 1.5 or more and the number ratio of carbon atom to silicon atom being 1 to 2, and having a shrinkage in the film thickness direction at a time of oxidation of 10% or less, a step of forming holes in a stack comprising the first insulating film, the coated insulating film and the second insulating film so as to expose a surface of the first wire, a step of filling a metal film in the holes, and a step of removing the metal film from outside of the holes.

23. A process according to claim 22, which further comprises a step of removing a resist used for forming the holes by a plasma treatment containing at least oxygen under a pressure of 50 mTorr or less between the step of forming the holes and the step of filling the metal film in the holes.

* * * * *